(12) United States Patent
Ling et al.

(10) Patent No.: US 12,150,306 B2
(45) Date of Patent: Nov. 19, 2024

(54) THREE-DIMENSIONAL MEMORY DEVICE AND METHOD

(71) Applicant: Taiwan Semiconductor Manufacturing Co., Ltd., Hsinchu (TW)

(72) Inventors: Chia Yu Ling, Hsinchu (TW); Chung-Te Lin, Tainan (TW); Katherine H. Chiang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 33 days.

(21) Appl. No.: 17/818,839

(22) Filed: Aug. 10, 2022

(65) Prior Publication Data

US 2023/0027039 A1 Jan. 26, 2023

Related U.S. Application Data

(62) Division of application No. 17/133,964, filed on Dec. 24, 2020, now Pat. No. 11,716,855.

(60) Provisional application No. 63/031,114, filed on May 28, 2020.

(51) Int. Cl.
| | |
|---|---|
| *H10B 51/20* | (2023.01) |
| *G11C 11/22* | (2006.01) |
| *H01L 29/06* | (2006.01) |
| *H10B 51/10* | (2023.01) |
| *H10B 51/30* | (2023.01) |

(52) U.S. Cl.
CPC .......... *H10B 51/20* (2023.02); *G11C 11/2255* (2013.01); *G11C 11/2257* (2013.01); *H01L 29/0649* (2013.01); *H10B 51/10* (2023.02); *H10B 51/30* (2023.02)

(58) Field of Classification Search
CPC ........ H10B 51/10; H10B 51/20; H10B 51/30; H01L 29/0649; H01L 29/0653; G11C 11/223; G11C 11/2255; G11C 11/2257
See application file for complete search history.

(56) References Cited

U.S. PATENT DOCUMENTS

| | | |
|---|---|---|
| 9,337,210 B2 | 5/2016 | Karda et al. |
| 9,847,342 B2 | 12/2017 | Nagashima et al. |
| 10,083,982 B2 | 9/2018 | Shigemura et al. |
| 10,593,692 B2 | 3/2020 | Borukhov |
| 10,727,243 B1 * | 7/2020 | Lue .................. H10B 41/40 |
| 10,777,578 B2 | 9/2020 | Liu |

(Continued)

FOREIGN PATENT DOCUMENTS

| | | | |
|---|---|---|---|
| CN | 102122661 A * | 7/2011 | ......... G11C 16/0483 |
| CN | 109786390 A | 5/2019 | |

(Continued)

*Primary Examiner* — Matthew E Warren
(74) *Attorney, Agent, or Firm* — Slater Matsil, LLP

(57) ABSTRACT

In an embodiment, a device includes: a pair of dielectric layers; a word line between the dielectric layers, sidewalls of the dielectric layers being recessed from a sidewall of the word line; a tunneling strip on a top surface of the word line, the sidewall of the word line, a bottom surface of the word line, and the sidewalls of the dielectric layers; a semiconductor strip on the tunneling strip; a bit line contacting a sidewall of the semiconductor strip; and a source line contacting the sidewall of the semiconductor strip.

20 Claims, 35 Drawing Sheets

(56) References Cited

U.S. PATENT DOCUMENTS

| | | |
|---|---|---|
| 2014/0192594 A1 | 7/2014 | Lue |
| 2016/0071871 A1* | 3/2016 | Kamigaichi |
| 2018/0006041 A1* | 1/2018 | Xu .................... H01L 29/7926 |
| 2018/0033799 A1* | 2/2018 | Kanamori ............. H10B 43/35 |
| 2019/0123061 A1 | 4/2019 | Liu |
| 2019/0244933 A1 | 8/2019 | Or-Bach et al. |
| 2019/0333930 A1 | 10/2019 | Borukhov |
| 2020/0035700 A1 | 1/2020 | Xu et al. |
| 2020/0075631 A1 | 3/2020 | Dong et al. |
| 2021/0257407 A1* | 8/2021 | Han ................... H01L 29/0649 |

FOREIGN PATENT DOCUMENTS

| | | | |
|---|---|---|---|
| CN | 109863597 A | 6/2019 | |
| KR | 20210037316 A * | 4/2021 | ............... G11C 5/06 |
| TW | 201515224 A | 4/2015 | |
| TW | 201807811 A | 3/2018 | |
| TW | 202008564 A | 2/2020 | |
| WO | WO-2011096601 A1 * | 8/2011 | ......... G11C 16/0408 |
| WO | 2019152226 A1 | 8/2019 | |

* cited by examiner

THREE-DIMENSIONAL MEMORY DEVICE AND METHOD

PRIORITY CLAIM AND CROSS-REFERENCE

This application is a division of U.S. patent application Ser. No. 17/133,964 filed on Dec. 24, 2020, entitled "Three-Dimensional Memory Device and Method," which claims the benefit of U.S. Provisional Application No. 63/031,114 filed on May 28, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
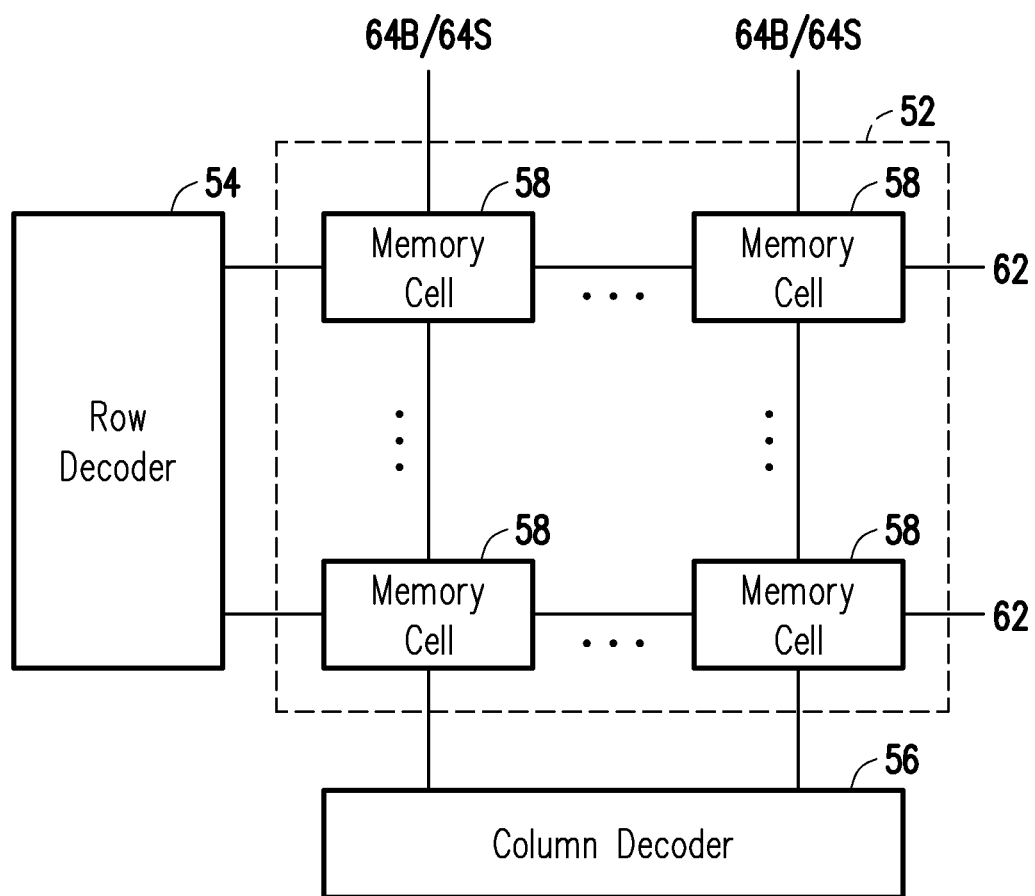
FIG. 1 is a block diagram of a random-access memory.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, three-dimensional memory arrays are formed of thin film transistors (TFTs) having three-dimensional channel regions. Such channel regions can be formed by forming word lines between dielectric layers, and recessing the sidewalls of the dielectric layers from the sidewalls of the word lines. Film stacks for the TFTs are then deposited along the sidewalls of the word lines and along the top and bottom surfaces of the word lines exposed by the recessing. Bit and source lines are formed in contact with the film stacks for the TFTs, thereby completing formation of the TFTs. Forming TFTs with three-dimensional channel regions may allow the performance of the TFTs to be improved.

FIG. 1 is a block diagram of a random-access memory 50. The random-access memory 50 includes a memory array 52, a row decoder 54, and a column decoder 56. The memory array 52, the row decoder 54, and the column decoder 56 may each be part of a same semiconductor die, or may be parts of different semiconductor dies. For example, the memory array 52 can be part of a first semiconductor die, while the row decoder 54 and the column decoder 56 can be parts of a second semiconductor die.

The memory array 52 includes memory cells 58, word lines 62, bit lines 64B, and source lines 64S. The memory cells 58 are arranged in rows and columns. The word lines 62, the bit lines 64B, and the source lines 64S are electrically connected to the memory cells 58. The word lines 62 are conductive lines that extend along the rows of the memory cells 58. The bit lines 64B and the source lines 64S are conductive lines that extend along the columns of the memory cells 58.

The row decoder 54 may be, e.g., a static CMOS decoder, a pseudo-NMOS decoder, or the like. During operation, the row decoder 54 selects desired memory cells 58 in a row of the memory array 52 by activating the word line 62 for the row. The column decoder 56 may be, e.g., a static CMOS decoder, a pseudo-NMOS decoder, or the like, and may include writer drivers, sense amplifiers, combinations thereof, or the like. During operation, the column decoder 56 selects the desired memory cells 58 from columns of the memory array 52 in the selected row, and reads data from or writes data to the selected memory cells 58 with the bit lines 64B and the source lines 64S.

Figure 2A:
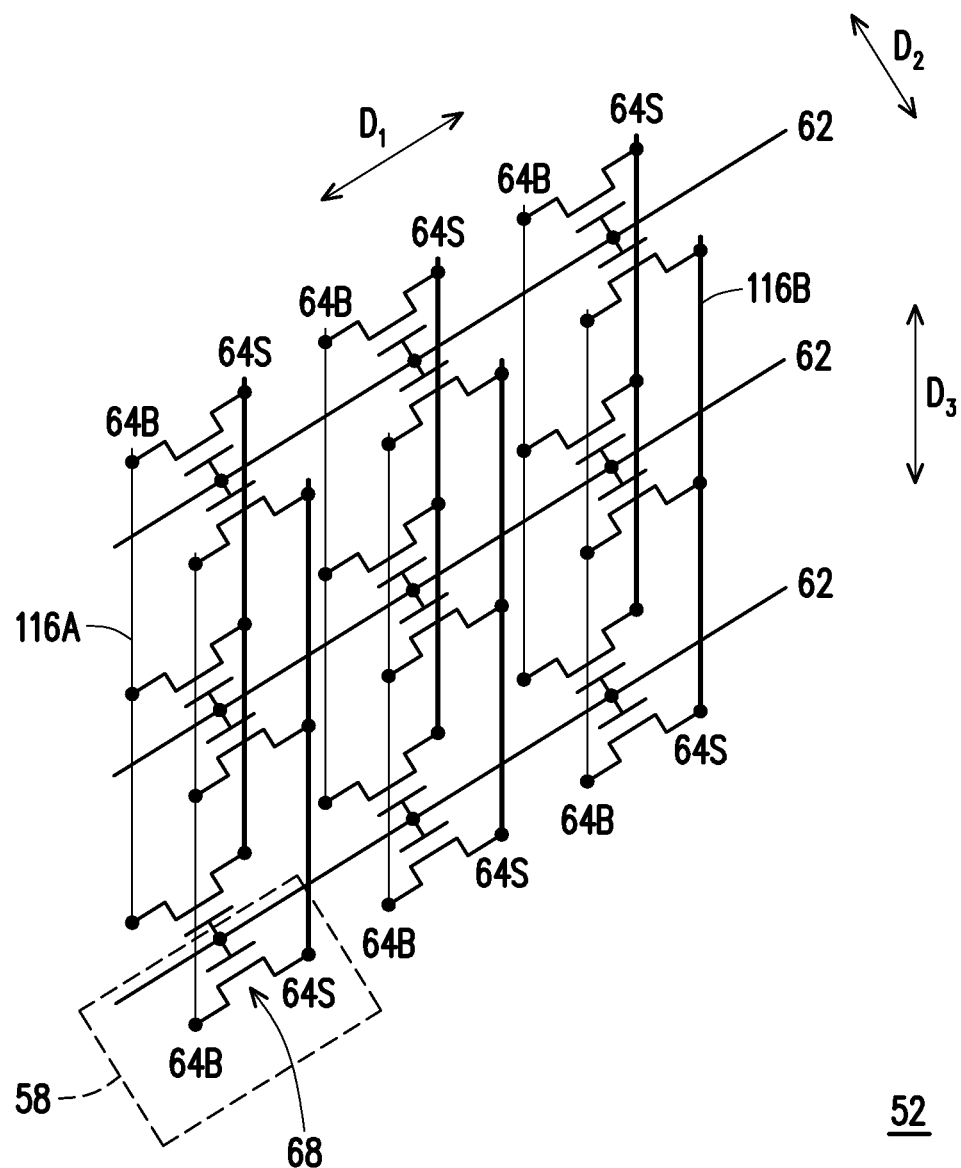
FIGS. 2A and 2B are various views of a memory array.
Figure 2B:
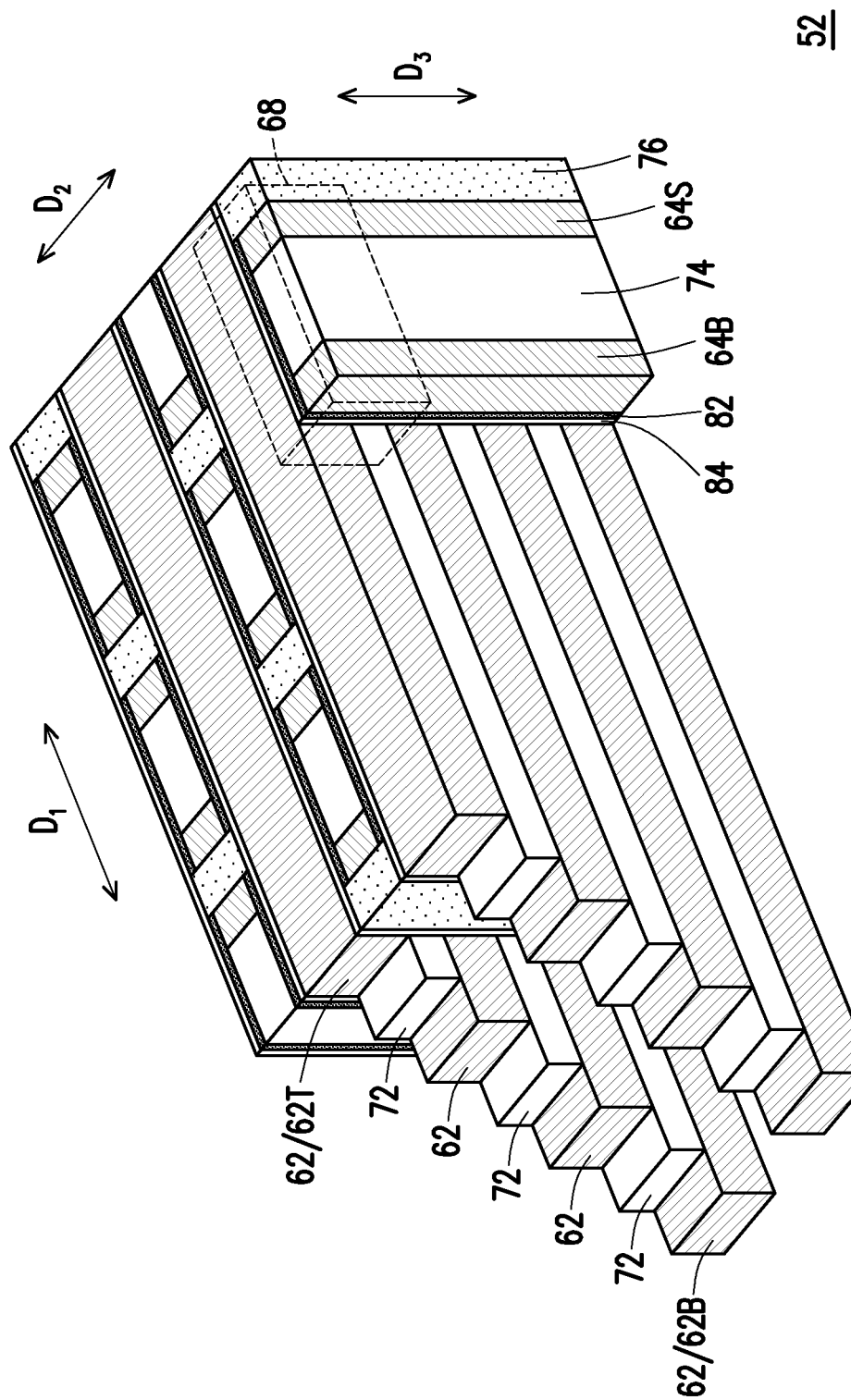

FIGS. 2A and 2B are various views of a memory array 52. FIG. 2A is a circuit diagram of the memory array 52. FIG. 2B is a three-dimensional view of a portion of the memory array 52, and is described in conjunction with FIG. 2A. Each memory cell 58 of the memory array 52 is a flash memory cell that includes a programmable TFT.

FIGS. 2A and 2B illustrate three perpendicular directions $D_1$, $D_2$, and $D_3$, which subsequent figures refer to for clarity of illustration. The first direction $D_1$ is parallel to a major surface of an underlying substrate. The second direction $D_2$ is perpendicular to the first direction $D_1$ and is parallel to the major surface of the underlying substrate. The third direction $D_3$ is perpendicular to the first direction $D_1$, the second direction $D_2$, and the major surface of the underlying substrate.

In some embodiments, the memory array 52 is a flash memory array, such as a NOR flash memory array. In some embodiments, the memory array 52 is another type of non-volatile memory array, such as a magnetoresistive random-access memory (MRAM) array, a resistive random-access memory (RRAM) array, or the like. Each of the memory cells 58 is a flash memory cell that includes a TFT 68. The gate of each TFT 68 is electrically connected to a respective word line 62, a first source/drain region of each TFT 68 is electrically connected to a respective bit line 64B, and a second source/drain region of each TFT 68 is electrically connected to a respective source line 64S (which are each electrically connected to ground). The memory cells 58 in a same row of the memory array 52 share a common word line 62 while the memory cells in a same column of the memory array 52 share a common bit line 64B and a common source line 64S.

The memory array 52 includes multiple horizontally arranged conductive lines (e.g., the word lines 62) with each of the word lines 62 disposed between dielectric layers 72. The word lines 62 extend in the first direction $D_1$. The word lines 62 may have a staircase arrangement such that lower word lines 62 are longer than and extend laterally past endpoints of upper word lines 62. For example, in FIG. 2B, multiple, stacked layers of word lines 62 are illustrated with the topmost word lines 62T being the shortest lines and the bottommost word lines 62B being the longest lines. Respective lengths of the word lines 62 increase in a direction extending towards the underlying substrate. In this manner, a portion of each word line 62 may be accessible from above the memory array 52, so that conductive contacts may be formed to an exposed portion of each word line 62.

The bit lines 64B and the source lines 64S are vertically arranged conductive lines. The bit lines 64B and the source lines 64S extend in the third direction $D_3$. An isolation region 74 is disposed between and isolates adjacent ones of the bit lines 64B and the source lines 64S. The boundaries of each memory cell 58 are defined by pairs of the bit lines 64B and the source lines 64S along with an intersecting word line 62. An isolation region 76 is disposed between and isolates adjacent TFTs 68 (e.g., adjacent pairs of the bit lines 64B and the source lines 64S). Although FIGS. 2A and 2B illustrate a particular placement of the bit lines 64B relative the source lines 64S, it should be appreciated that the placement of the bit lines 64B and the source lines 64S may be flipped in other embodiments.

The memory array 52 further includes semiconductor strips 82 and tunneling strips 84. The tunneling strips 84 are in contact with the word lines 62. The semiconductor strips 82 are disposed between the tunneling strips 84 and the bit lines 64B, the source lines 64S, and the isolation regions 74.

The semiconductor strips 82 provide channel regions for the TFTs 68 of the memory cells 58, and can also be referred to as channel layers. For example, when an appropriate voltage (e.g., higher than a respective threshold voltage of a corresponding TFT 68) is applied through a corresponding word line 62, a portion of a semiconductor strip 82 that intersects the word line 62 may allow current to flow from a bit line 64B to a corresponding source line 64S (e.g., in the first direction $D_1$). In FIG. 2B, each semiconductor strip 82 contacts one surface of each corresponding word line 62, thus providing planar channel regions for the TFTs 68. As discussed in greater detail below, according to various embodiments, the semiconductor strips 82 are formed to contact multiple surfaces of the corresponding word lines 62, thus providing three-dimensional channel regions for the TFTs 68.

The tunneling strips 84 can be polarized in one of two different directions by applying an appropriate voltage across the tunneling strips 84, and can also be referred to as data storage layers. Depending on a polarization direction of a particular portion of a tunneling strip 84, a threshold voltage of a corresponding TFT 68 varies and a digital value (e.g., 0 or 1) can be stored. For example, when a portion of a tunneling strip 84 has a first electrical polarization direction, the corresponding TFT 68 may have a relatively low threshold voltage, and when the portion of the tunneling strip 84 has a second electrical polarization direction, the corresponding TFT 68 may have a relatively high threshold voltage. The difference between the two threshold voltages may be referred to as the threshold voltage shift. A larger threshold voltage shift makes it easier (e.g., less error prone) to read the digital value stored in the corresponding memory cell 58. In some embodiments, the tunneling strips 84 are formed of a high-k ferroelectric material, and thus the memory array 52 may also be referred to as a ferroelectric random access memory (FeRAM) array.

To perform a write operation on a particular memory cell 58, a write voltage is applied across a portion of the tunneling strip 84 corresponding to the memory cell 58. The write voltage can be applied, for example, by applying appropriate voltages to the word line 62, the bit line 64B, and the source line 64S corresponding to the memory cell 58. By applying the write voltage across the portion of the tunneling strip 84, a polarization direction of the portion of the tunneling strip 84 can be changed. As a result, the corresponding threshold voltage of the corresponding TFT 68 can be switched from a low threshold voltage to a high threshold voltage (or vice versa), so that a digital value can be stored in the memory cell 58. Because the word lines 62 and the bit lines 64B intersect in the memory array 52, individual memory cells 58 may be selected and written to.

To perform a read operation on a particular memory cell 58, a read voltage (a voltage between the low and high threshold voltages) is applied to the word line 62 corresponding to the memory cell 58. Depending on the polarization direction of the corresponding portion of the tunneling strip 84, the TFT 68 of the memory cell 58 may or may not be turned on. As a result, the bit line 64B may or may not be discharged (e.g., to ground) through the source line 64S, so that the digital value stored in the memory cell 58 can be determined. Because the word lines 62 and the bit lines 64B intersect in the memory array 52, individual memory cells 58 may be selected and read from.

Figure 9A:
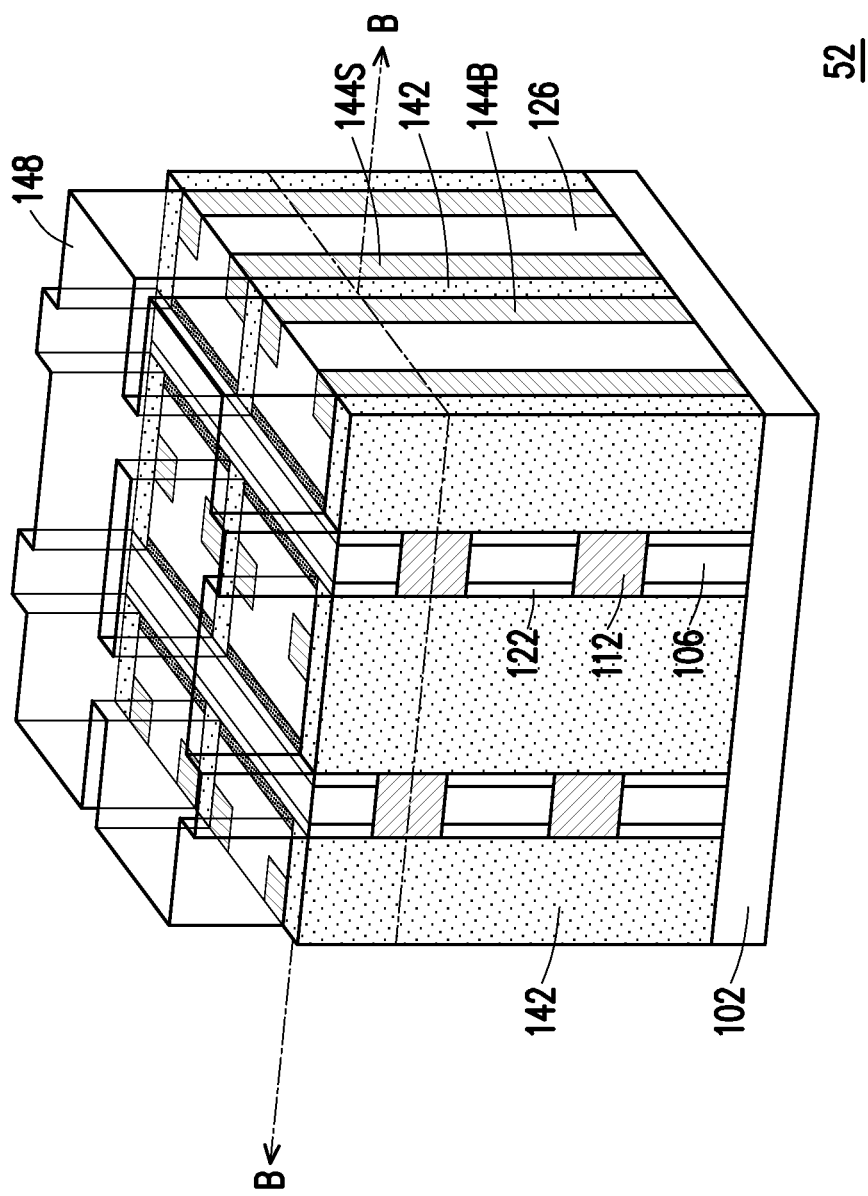
Figure 9B:
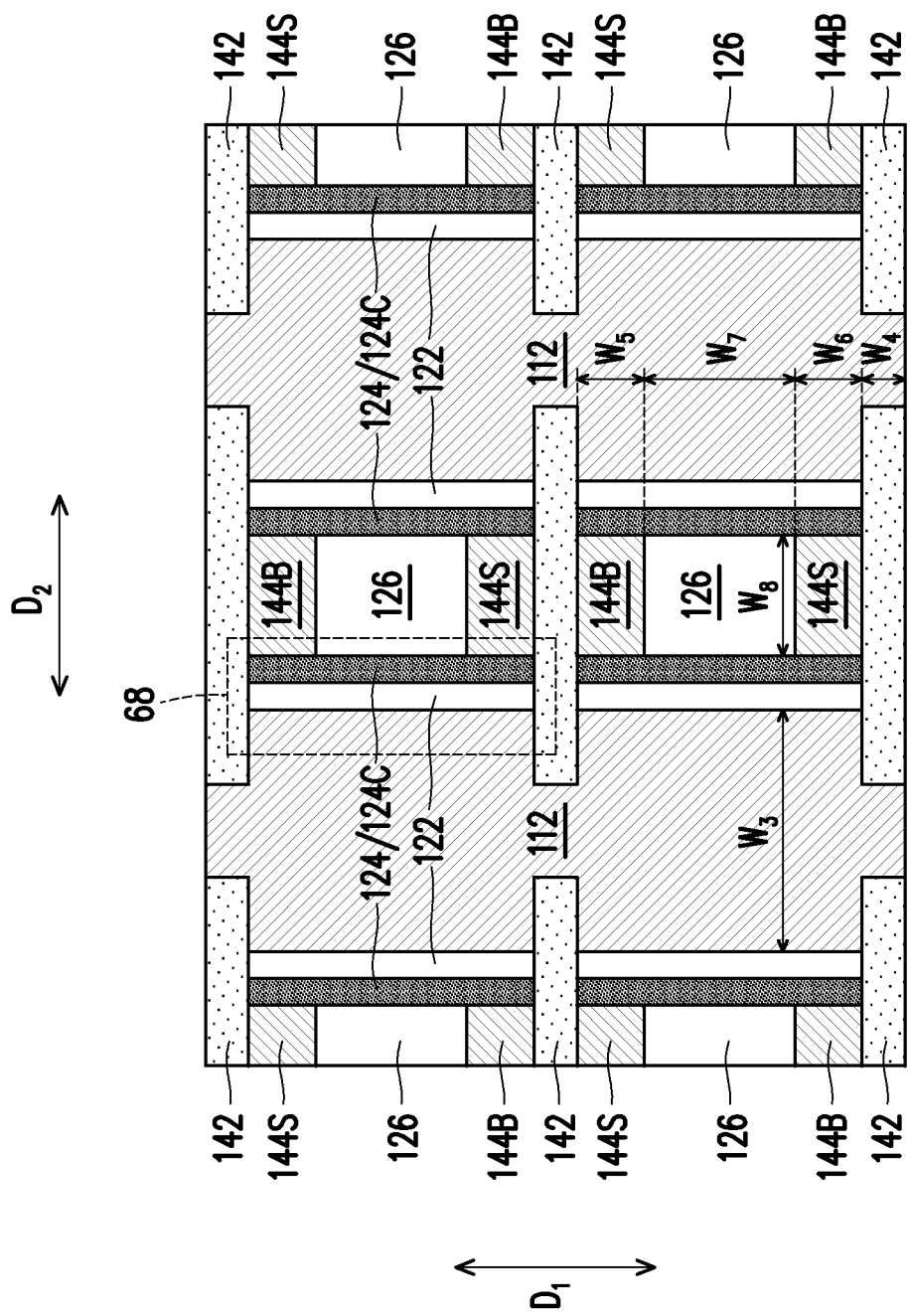
Figure 10:
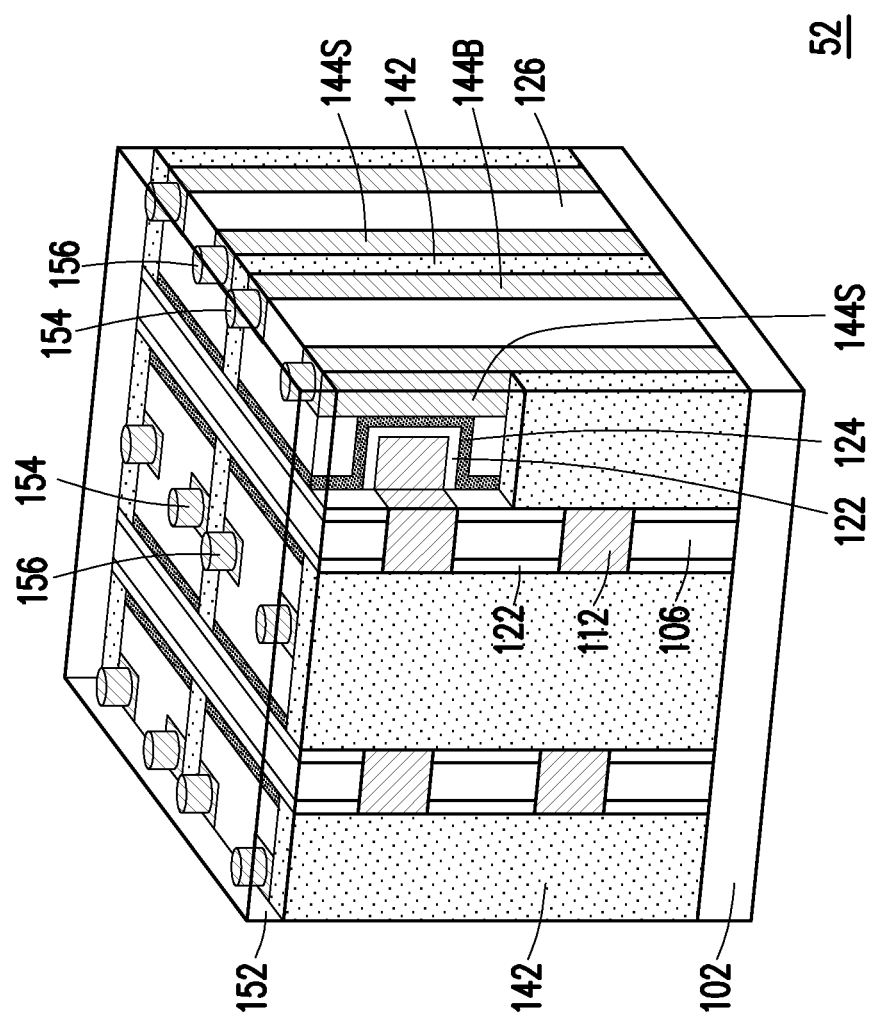
Figure 11A:
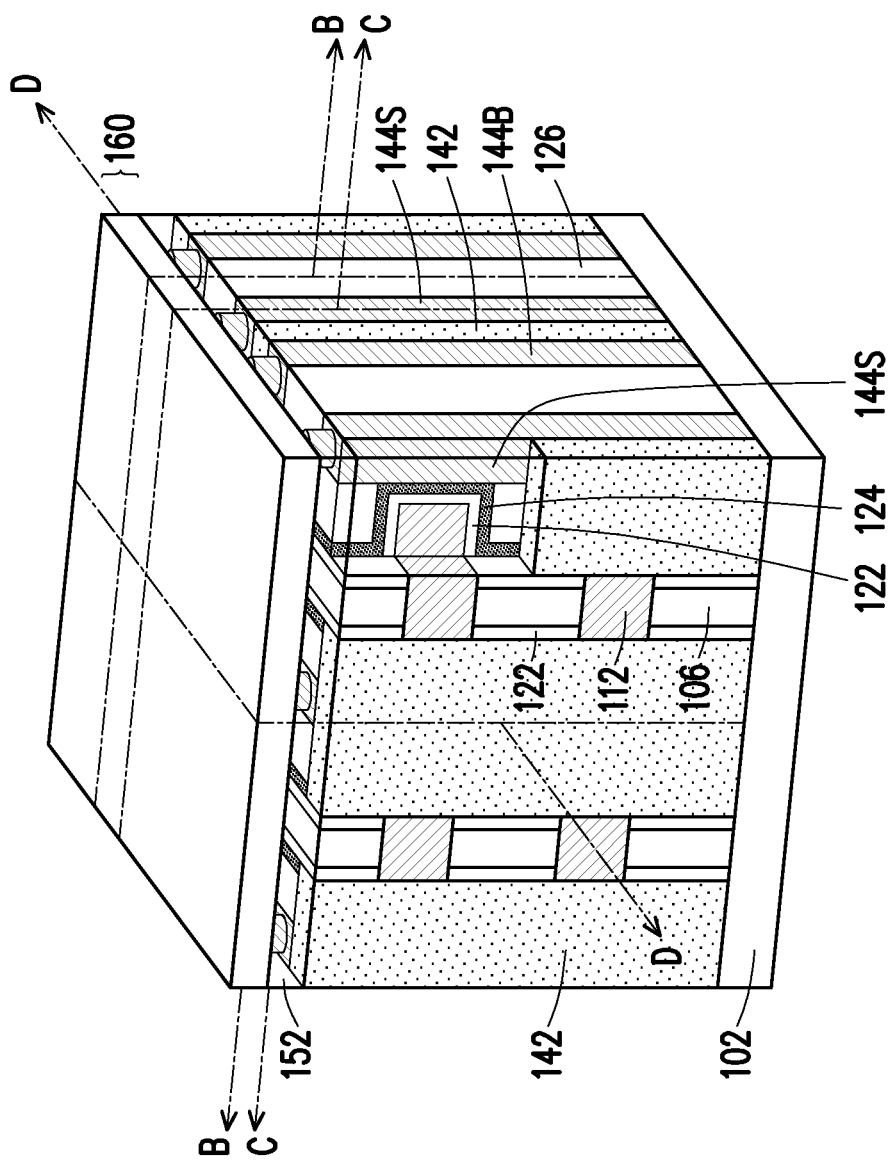
Figure 11B:
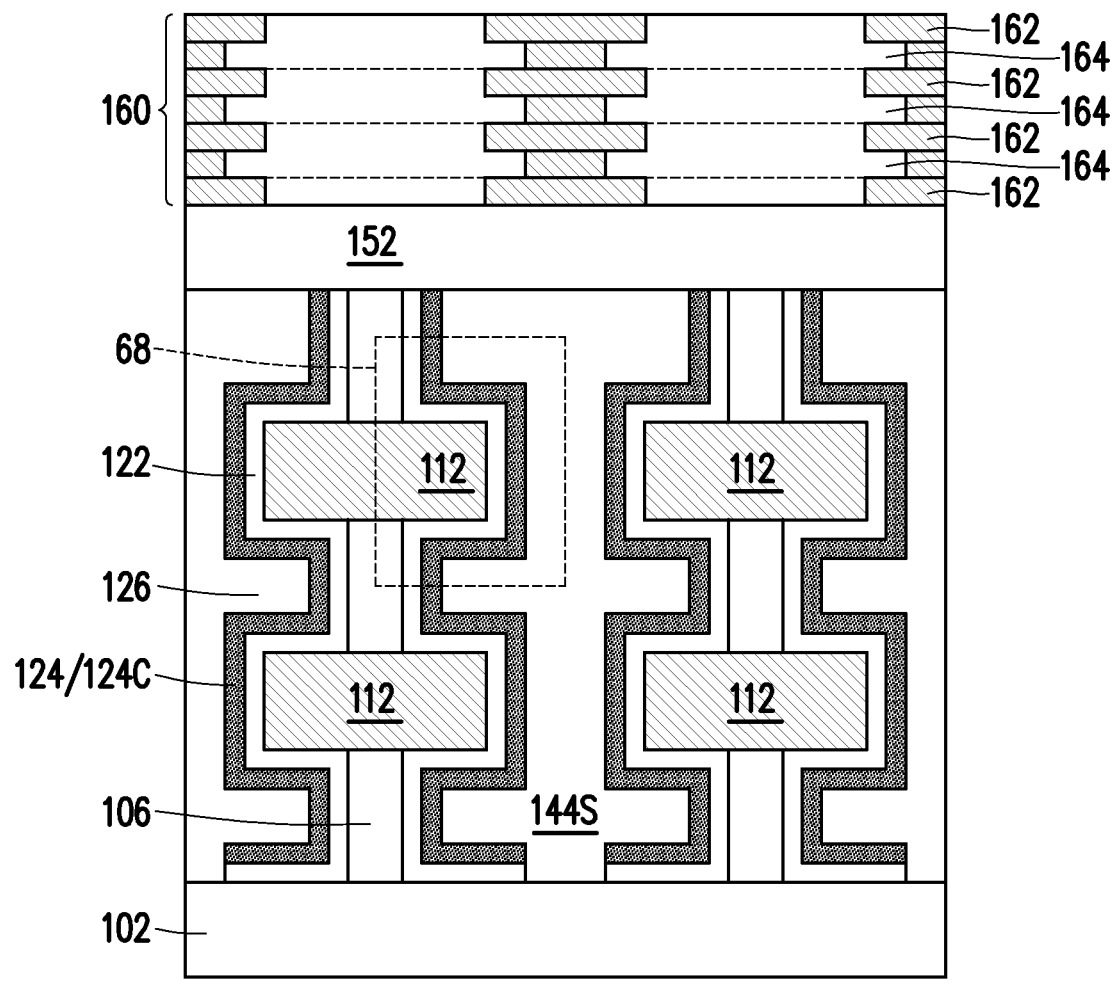
Figure 11C:
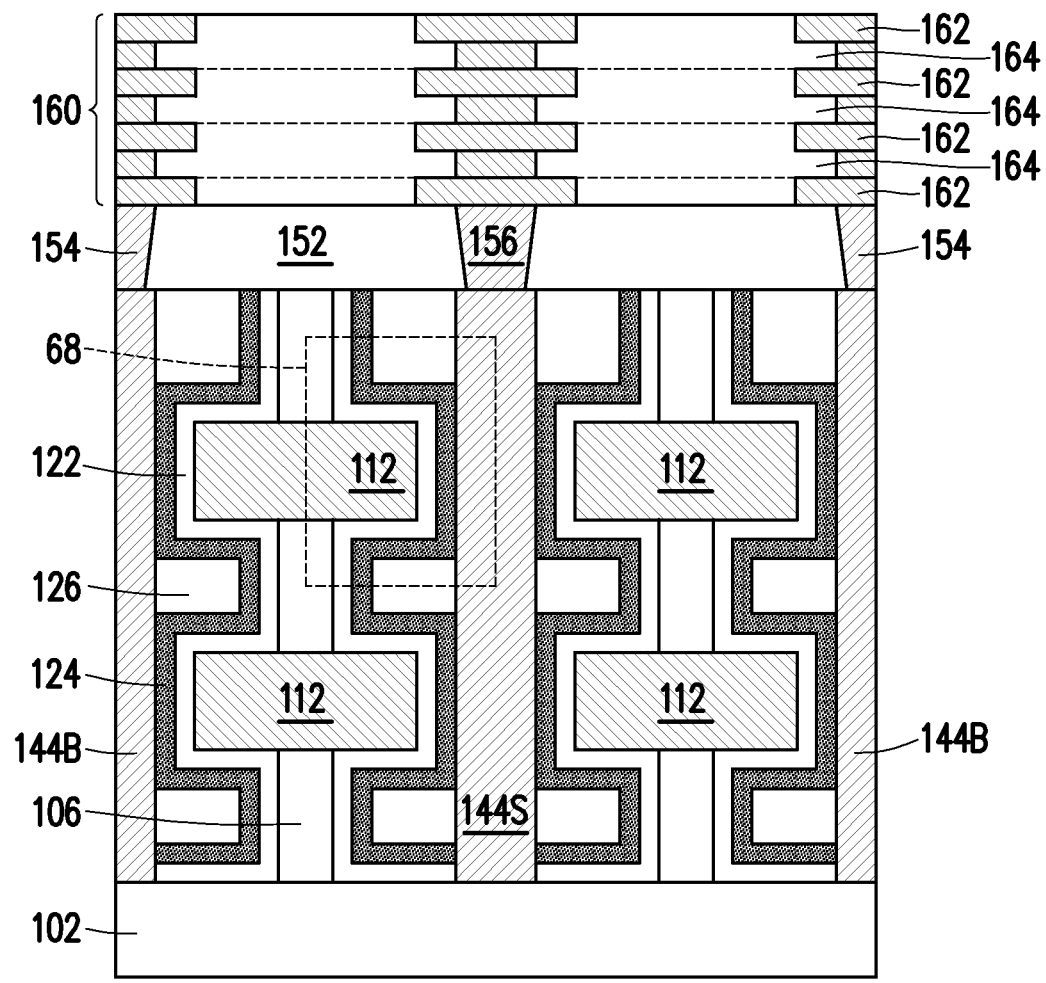
Figure 11D:
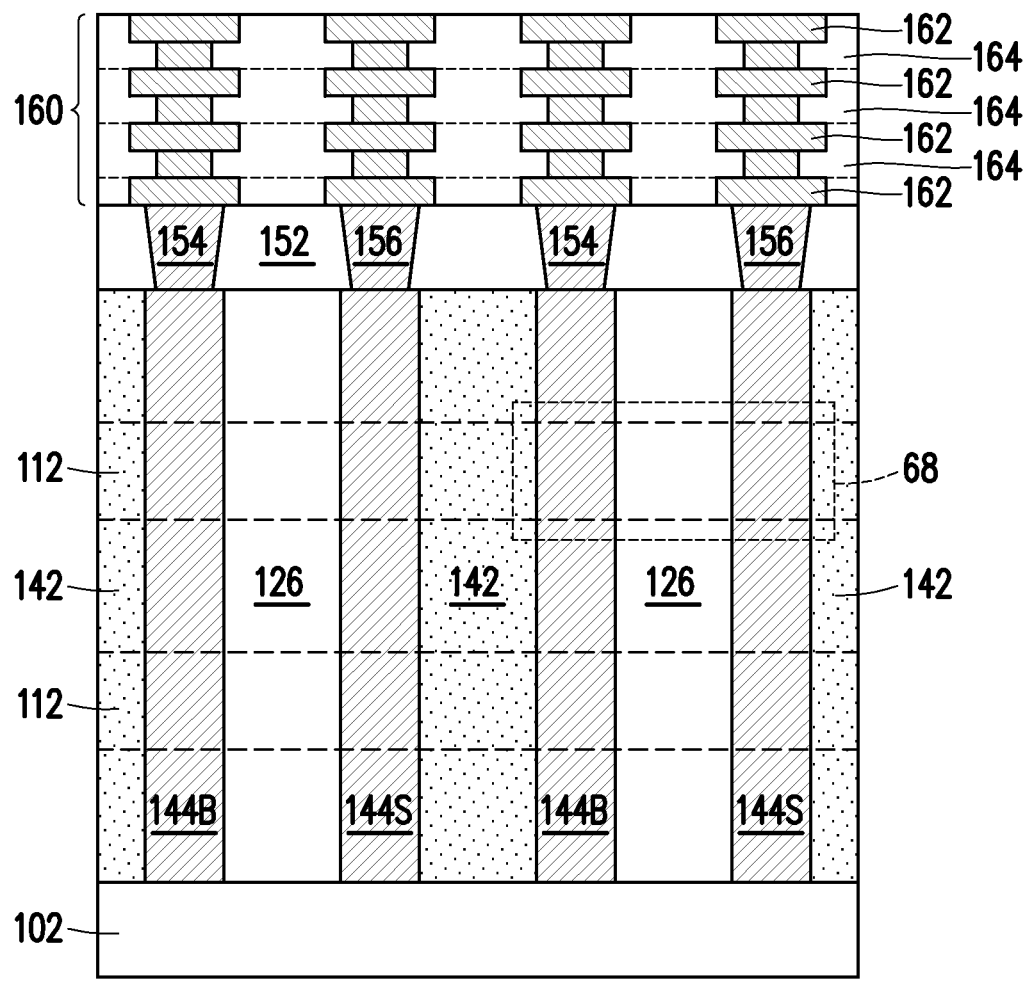

FIGS. 3 through 11D are various views of intermediate stages in the manufacturing of a memory array 52, in accordance with some embodiments. FIGS. 3, 4, 5, 6, 7A, 8A, 9A, 10, and 11A are three-dimensional views. FIGS. 7B, 8B, and 9B are cross-sectional views shown along reference cross-sections B-B in FIGS. 7A, 8A, and 9A, respectively. FIGS. 11B, 11C, and 11D are cross-sectional views shown along reference cross-sections B-B, C-C, and D-D, respectively, in FIG. 11A. A portion of the memory array 52 is illustrated. Some features, such as the staircase arrangement of the word lines (see FIG. 2B), are not shown for clarity of illustration.

Figure 3:
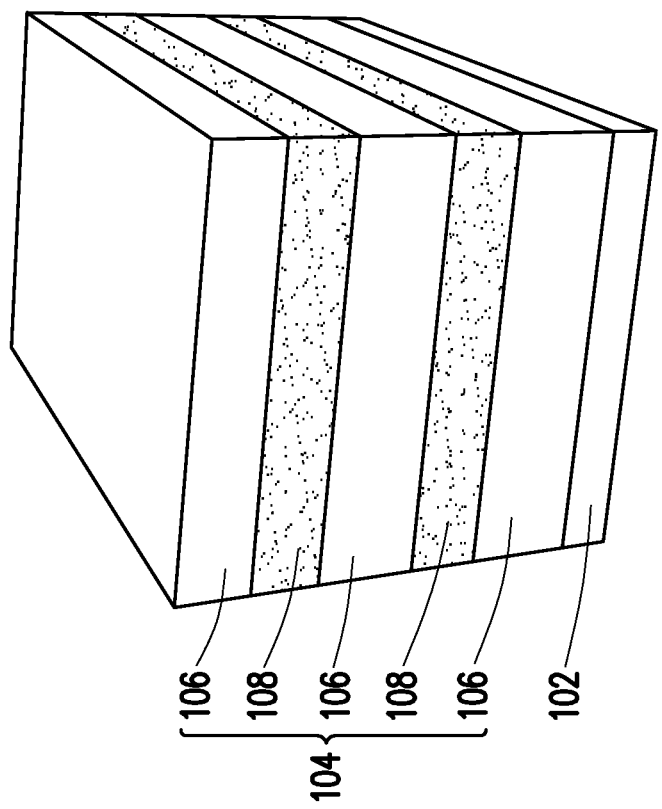
FIGS. 3 through 11D are various views of intermediate stages in the manufacturing of a memory array, in accordance with some embodiments.

In FIG. 3, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multilayered or gradient substrate may also be used. In some embodiments, the semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. The substrate 102 may include a dielectric material. For example, the substrate 102 may be a dielectric substrate, or may include a dielectric layer on a semiconductor substrate. Acceptable dielectric materials for the substrate 102 include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. In some embodiments, the substrate 102 is formed of silicon carbide.

A multilayer stack 104 is formed over the substrate 102. The multilayer stack 104 includes alternating dielectric layers 106 and sacrificial layers 108. The dielectric layers 106 are formed of a first dielectric material, and the sacrificial layers 108 are formed of a second dielectric material. The dielectric materials may each be selected from the candidate dielectric materials of the substrate 102.

The multilayer stack 104 will be patterned in subsequent processing. As such, the dielectric materials of the dielectric layers 106 and the sacrificial layers 108 both have a high etching selectivity from the etching of the material of the substrate 102. The patterned dielectric layers 106 will be used to isolate subsequently formed TFTs. The patterned sacrificial layers 108 may also be referred to as dummy layers, and will be replaced with word lines for the TFTs in subsequent processing. As such, the second dielectric material of the sacrificial layers 108 also has a high etching selectivity from the etching of the first dielectric material of the dielectric layers 106. In embodiments where the substrate 102 is formed of silicon carbide, the dielectric layers 106 can be formed of silicon oxide, and the sacrificial layers 108 can be formed of silicon nitride. Other combinations of dielectric materials having acceptable etching selectivity from one another may also be used.

Each layer of the multilayer stack 104 may be formed by an acceptable deposition process such as chemical vapor deposition (CVD), atomic layer deposition (ALD), or the like. A thickness of each of the layers may be in the range of about 40 nm to about 50 nm. In some embodiments, the dielectric layers 106 are formed to a different thickness than the sacrificial layers 108. For example, the dielectric layers 106 can be formed to a greater thickness than the sacrificial layers 108. In the illustrated embodiment, the multilayer stack 104 includes three layers of the dielectric layers 106 and two layers of the sacrificial layers 108. It should be appreciated that the multilayer stack 104 may include other quantities of the dielectric layers 106 and the sacrificial layers 108. The multilayer stack 104 can have an overall height in the range of about 1000 nm to about 10000 nm.

Figure 4:
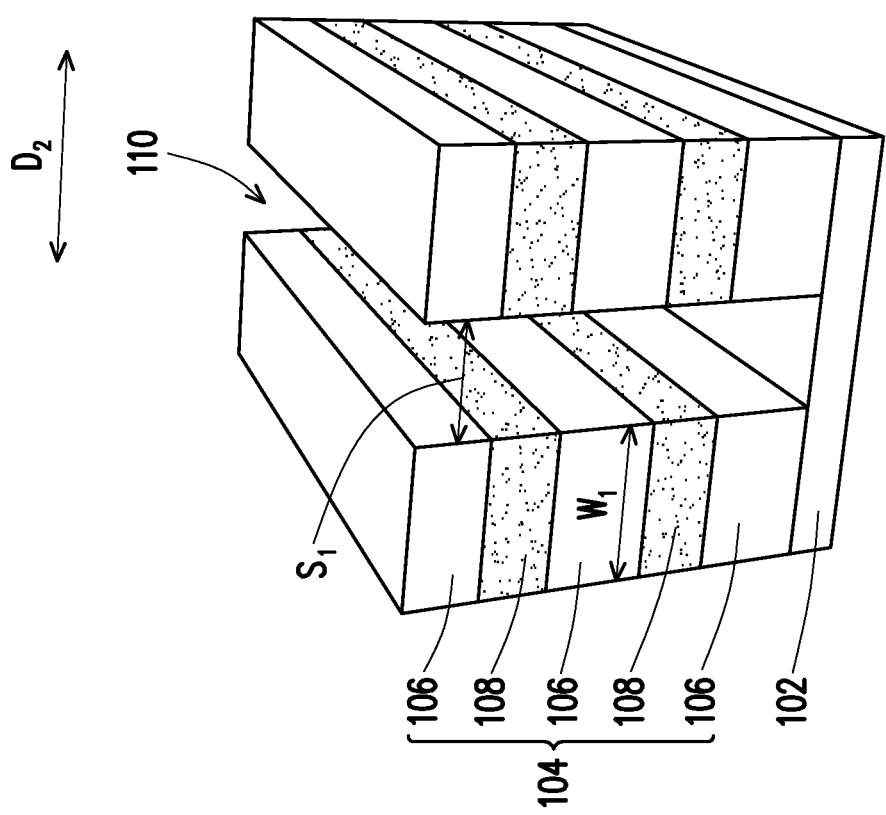

In FIG. 4, trenches 110 are patterned in the multilayer stack 104. In the illustrated embodiment, the trenches 110 extend through the multilayer stack 104 and expose the substrate 102. In another embodiment, the trenches 110 extend through some but not all layers of the multilayer stack 104. The trenches 110 may be patterned using acceptable photolithography and etching techniques, such as with an etching process that is selective to the multilayer stack 104 (e.g., selectively removes the dielectric materials of the dielectric layers 106 and the sacrificial layers 108 at a faster rate than the material of the substrate 102). The etching may be any acceptable etch process, such as a reactive ion etch (RIE), neutral beam etch (NBE), the like, or a combination thereof. The etching may be anisotropic. In embodiments where the substrate 102 is formed of silicon carbide, the dielectric layers 106 are formed of silicon oxide, and the sacrificial layers 108 are formed of silicon nitride, the trenches 110 can be formed by a dry etch using a fluorine-based gas (e.g., $C_4F_6$) mixed with hydrogen ($H_2$) or oxygen ($O_2$) gas. After the patterning, respective portions of the multilayer stack 104 are disposed between respective ones of the trenches 110. Each portion of the multilayer stack 104 has a width $W_1$ in the second direction $D_2$, which can be in the range of about 100 nm to about 120 nm. Further, each portion of the multilayer stack 104 is separated by a separation distance $S_1$ in the second direction $D_2$, which can be in the range of about 75 nm to about 85 nm.

Figure 5:
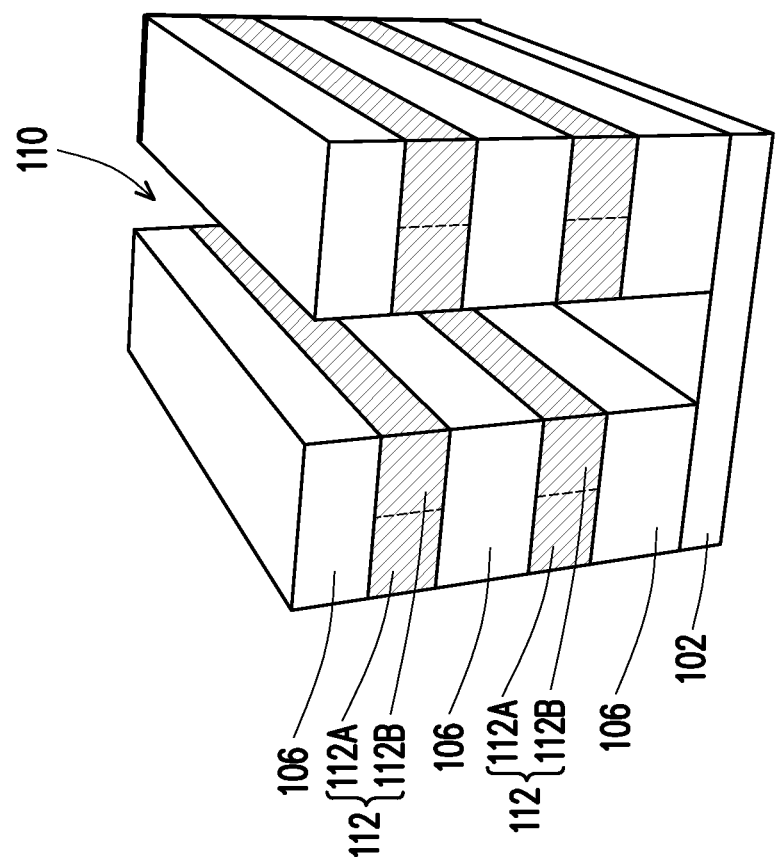

In FIG. 5, the sacrificial layers 108 are replaced with word lines 112. The word lines 112 each include a main layer, and may include one or more additional layers such as glue layers, barrier layers, diffusion layers, and the like. In some embodiments, the word lines 112 each include a main layer and one or more glue layers. For example, the glue layers can extend along the top and bottom surfaces of the main layers. The glue layers can be formed of a first conductive material that has good adhesion to the material of the dielectric layers 106, such as a metal nitride, such as titanium nitride, tantalum nitride, molybdenum nitride, zirconium nitride, hafnium nitride, or the like. The main layers can be formed of a second conductive material that has good adhesion to the material of the glue layers, such as a metal, such as tungsten, ruthenium, molybdenum, cobalt, aluminum, nickel, copper, silver, gold, alloys thereof, or the like. The material(s) of the word lines 112 may each be formed by an acceptable deposition process such as chemical vapor deposition (CVD), atomic layer deposition (ALD), or the like.

The word lines 112 may include multiple conductive features formed in different processes. For example, first conductive features 112A may be formed to replace some portions of the sacrificial layers 108, and subsequently second conductive features 112B may be formed to replace remaining portions of the sacrificial layers 108. In such embodiments, a lateral etch is performed to expand a first subset of the trenches 110 while a second subset of the trenches 110 are masked. Specifically, portions of the sidewalls of the sacrificial layers 108 exposed by the trenches 110 are recessed to form sidewall recesses. The sidewall recesses may be formed by an acceptable etching process, such as one that is selective to the material of the sacrificial layers 108 (e.g., selectively removes the material of the sacrificial layers 108 at a faster rate than the material(s) of the dielectric layers 106 and the substrate 102). The etching may be isotropic. In embodiments where the substrate 102 is formed of silicon carbide, the dielectric layers 106 are formed of silicon oxide, and the sacrificial layers 108 are formed of silicon nitride, the trenches 110 can be expanded by a wet etch using phosphoric acid ($H_3PO_4$). In another embodiment, a dry etch selective to the material of the sacrificial layers 108 may be used. The material(s) of the word lines 112 are then conformally deposited in the sidewall recesses to form the first conductive features 112A. An acceptable etch process, such as a dry etch (e.g., a reactive ion etch (RIE), neutral beam etch (NBE), the like), a wet etch, the like, or a combination thereof, may be performed to remove excess material(s) of the word lines 112 from the sidewalls of the dielectric layers 106 and the top surface of the substrate 102. The etching may be anisotropic. The process discussed above may then be repeated to form the second conductive features 112B. The first conductive features 112A and the second conductive features 112B are collectively referred to as word lines 112 of the memory array 52.

It should be appreciated that the dielectric layers 106 and the word lines 112 may be formed in other manners. For example, instead of forming the multilayer stack 104 of FIG. 3 and replacing the sacrificial layers 108 with word lines 112, a multilayer stack of alternating dielectric layers and conductive layers may be formed. The multilayer stack may be patterned with trenches to form the word lines 112 from remaining portions of the conductive layers.

Figure 6:
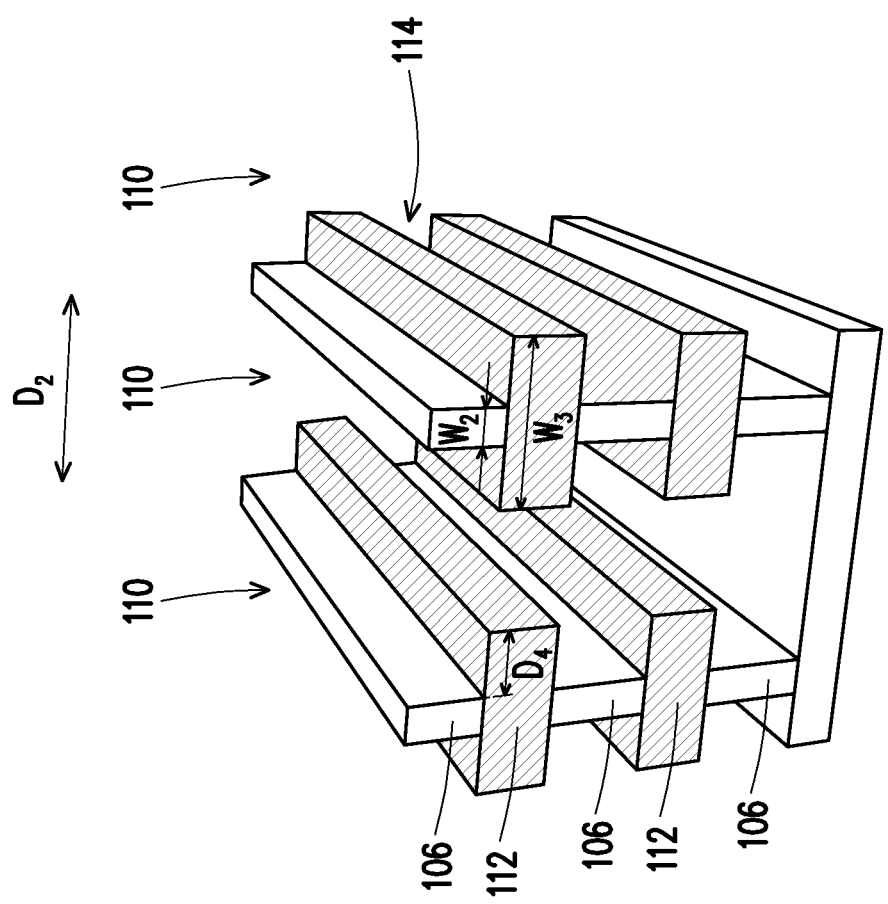

In FIG. 6, the trenches 110 are expanded to form sidewall recesses 114. Specifically, portions of the sidewalls of the dielectric layers 106 exposed by the trenches 110 are recessed to form the sidewall recesses 114. Although sidewalls of the dielectric layers 106 are illustrated as being straight, the sidewalls may be concave or convex. The sidewall recesses 114 may be formed by an acceptable etching process, such as one that is selective to the material of the dielectric layers 106 (e.g., selectively removes the material of the dielectric layers 106 at a faster rate than the materials of the word lines 112 and the substrate 102). The etching may be isotropic. In embodiments where the substrate 102 is formed of silicon carbide, the dielectric layers 106 are formed of silicon oxide, and the word lines 112 are formed of tungsten, the trenches 110 can be expanded by a wet etch using dilute hydrofluoric acid (dHF). In another embodiment, the trenches 110 can be expanded by a dry etch using carbon tetrafluoride ($CF_4$).

After formation, the sidewall recesses 114 have a depth $D_4$ extending past the sidewalls of the dielectric layers 106. Timed etch processes may be used to stop the etching of the sidewall recesses 114 after the sidewall recesses 114 reach a desired depth $D_4$ in the second direction $D_2$. For example, the sidewall recesses 114 can be formed to a depth $D_4$ in the range of about 30 nm to about 40 nm. Forming the sidewall recesses 114 exposes the top and bottom surfaces of the word lines 112. As discussed in greater detail below, one or more layers provide channel regions and data storage for the subsequently formed TFTs are formed in the sidewall recesses 114, thus allowing the layers to contact the top surfaces and the bottom surfaces of the word lines 112. After the sidewall recesses 114 are formed, the remaining portions of the dielectric layers 106 have a width $W_2$ in the second direction $D_2$, which can be in the range of about 20 nm to about 40 nm, and the word lines 112 have a width $W_3$ in the second direction $D_2$, which can be in the range of about 100 nm to about 120 nm. Forming the sidewall recess 114 can reduce the widths of the dielectric layers 106 by about 60% to about 80%. Forming the sidewall recess 114 with dimensions in the ranges discussed herein allows the TFTs to be formed with channel regions of a desired length. Forming the sidewall recess 114 with dimensions outside of the ranges discussed herein may not allow the TFTs to be formed with channel regions of a desired length.

Figure 7A:
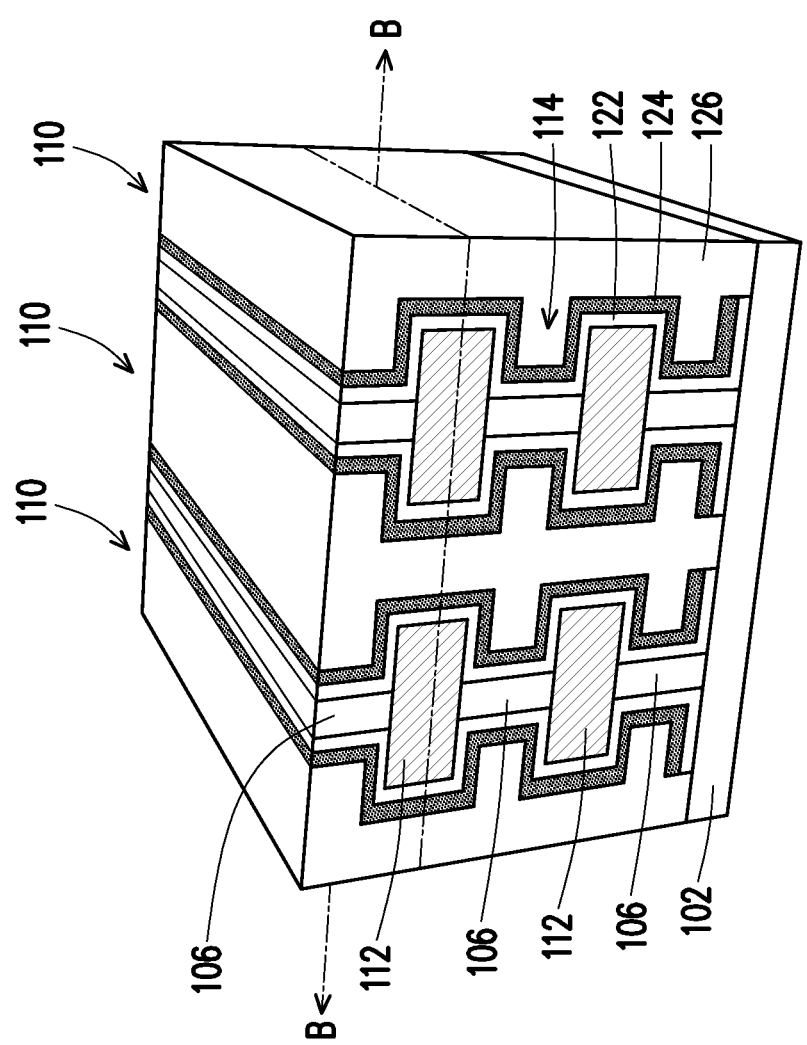
Figure 7B:
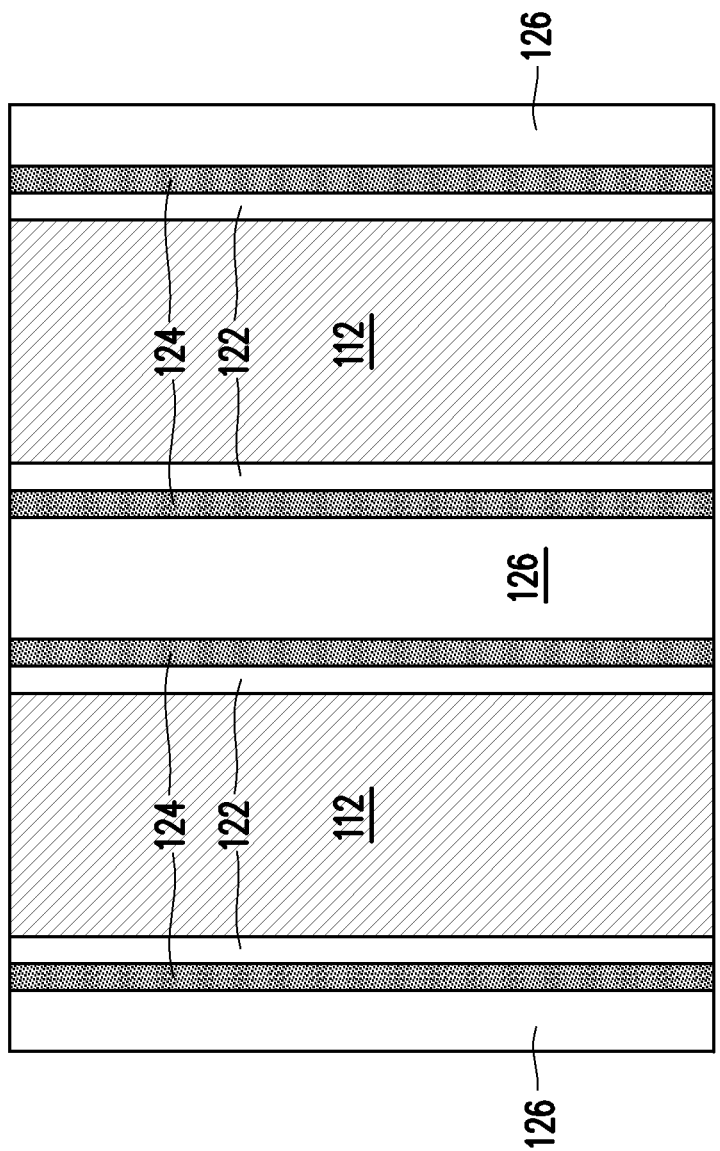

In FIGS. 7A and 7B, TFT film stacks are formed in the trenches 110 and the sidewall recesses 114. Specifically, two tunneling strips 122, two semiconductor strips 124, and an isolation region 126 are formed in each of the trenches 110 (and its corresponding sidewall recesses 114). In this embodiment, no other layers are formed in the trenches 110. In another embodiment (discussed in greater detail below) additional layers are formed in the trenches 110.

The tunneling strips 122 are data storage strips formed of an acceptable material for storing digital values. In some embodiments, the tunneling strips 122 are formed of a high-k ferroelectric material, such as hafnium zirconium oxide (HfZrO); zirconium oxide (ZrO); hafnium oxide (HfO) doped with lanthanum (La), silicon (Si), aluminum (Al), or the like; undoped hafnium oxide (HfO); or the like. In another embodiment (discussed further below), the tunneling strips 122 include a low-k dielectric material such as silicon nitride, silicon oxide, silicon oxynitride, or the like. The material of the tunneling strips 122 may be formed by an acceptable deposition process such as ALD, CVD, physical vapor deposition (PVD), or the like. The tunneling strips 122 can have a thickness in the range of about 9 nm to about 11 nm.

The semiconductor strips 124 are channel strips formed of an acceptable material for providing channel regions for the TFTs, such as indium gallium zinc tin oxide (IGZTO), indium gallium zinc oxide (IGZO), indium tin oxide (ITO), zinc oxide (ZnO), polysilicon, amorphous silicon, or the like. The material of the semiconductor strips 124 may be formed by an acceptable deposition process such as ALD, CVD, PVD, or the like. The semiconductor strips 124 can have a thickness in the range of about 9 nm to about 11 nm.

The isolation regions 126 are formed of an acceptable material for protecting and electrically isolating the underlying semiconductor strips 124 and tunneling strips 122. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride, or the like. The material of the isolation regions 126 may be formed by an acceptable deposition process such as ALD, CVD, flowable CVD (FCVD), or the like. The isolation regions 126 can have a thickness in the range of about 8 nm to about 14 nm.

The tunneling strips 122, the semiconductor strips 124, and the isolation regions 126 may be formed by a combination of deposition, etching, and planarization. For example, a tunneling layer is conformally deposited in the trenches 110 and the sidewall recesses 114. Specifically, the tunneling layer extends along the sidewalls of the word lines 112, the recessed sidewalls of the dielectric layers 106, and the top and bottom surfaces of the word lines 112 exposed by the sidewall recesses 114. In some embodiments, the tunneling layer is HfZrO deposited by ALD. The tunneling layer can optionally be anisotropically etched to remove portions of the tunneling layer at the bottoms of the trenches 110, thus exposing the substrate 102 and separating the tunneling strips of horizontally adjacent TFTs. A semiconductor layer is then conformally deposited on the tunneling layer and in the trenches 110 and the sidewall recesses 114.

In some embodiments, the semiconductor layer is IGZTO deposited by ALD. The semiconductor layer can then be anisotropically etched to remove portions of the semiconductor layer at the bottoms of the trenches 110, thus exposing the substrate 102 and separating the semiconductor strips of horizontally adjacent TFTs. A dielectric layer is then conformally deposited on the semiconductor layer and in the remaining portions of the trenches 110 and the sidewall recesses 114. In some embodiments, the dielectric layer is an oxide such as silicon oxide deposited by FCVD. A removal process is then applied to the various layers to remove excess materials over the topmost dielectric layer 106/word line 112. The removal process may be a planarization process such as a chemical mechanical polish (CMP), an etch-back, combinations thereof, or the like. The portions of the tunneling layer, the semiconductor layer, and the dielectric layer remaining in the trenches 110 form the tunneling strips 122, the semiconductor strips 124, and the isolation regions 126, respectively. The planarization process exposes the topmost dielectric layer 106/word line 112 such that top surfaces of the topmost dielectric layer 106/word line 112, the tunneling strips 122, the semiconductor strips 124, and the isolation regions 126 are coplanar (within process variations) after the planarization process.

At least the tunneling strips 122 and the semiconductor strips 124 have portions in the sidewall recesses 114. The isolation regions 126 may also have portions in the sidewall recesses 114. The tunneling strips 122 and the semiconductor strips 124 thus extend along the top and bottom surfaces of the word lines 112 exposed by the sidewall recesses 114, thus providing three-dimensional channel regions 124C (see FIG. 8B) for the TFTs. By increasing the contacted area of the word lines 112, the lengths of the channel regions 124C for the TFTs may thus be increased, thereby improving the performance and efficiency of the TFT as compared to TFTs with planar channel regions. For example, three-dimensional channel regions can a produce a greater electric field with lower gate voltages than planar channel regions. Increasing the electric field in the channel regions can help improve the write speed of the memory array 52.

Figure 8A:
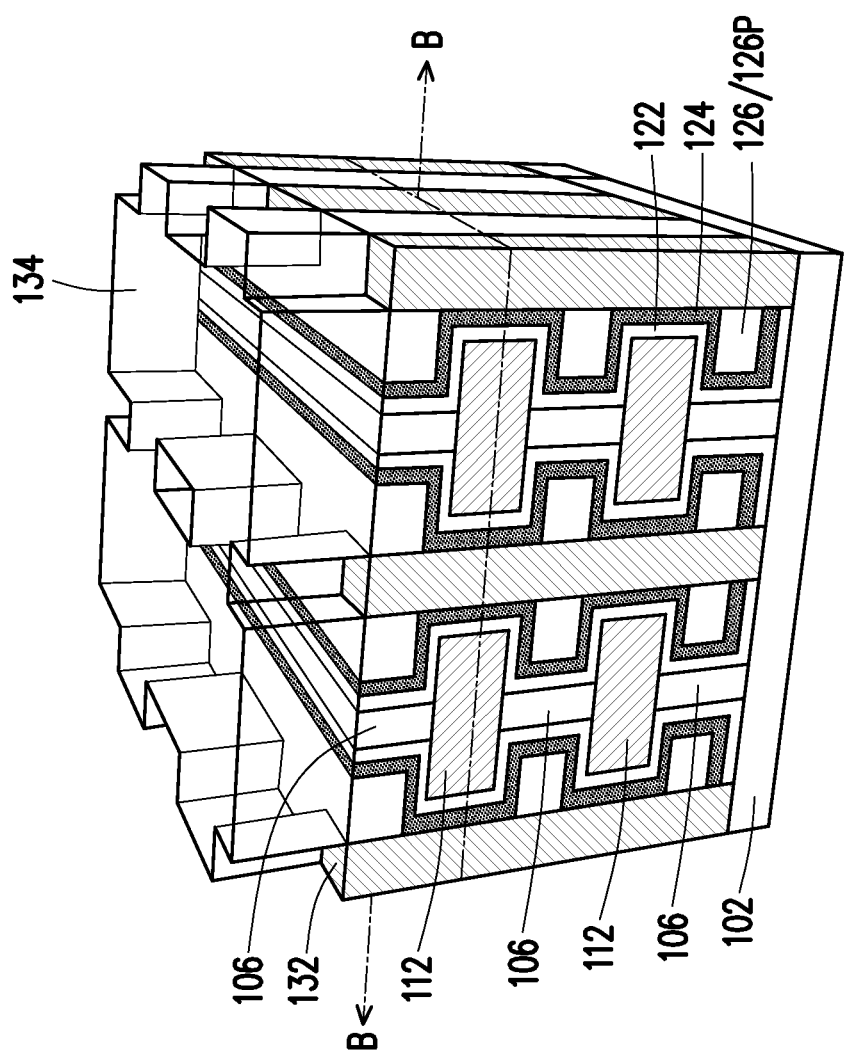
Figure 8B:
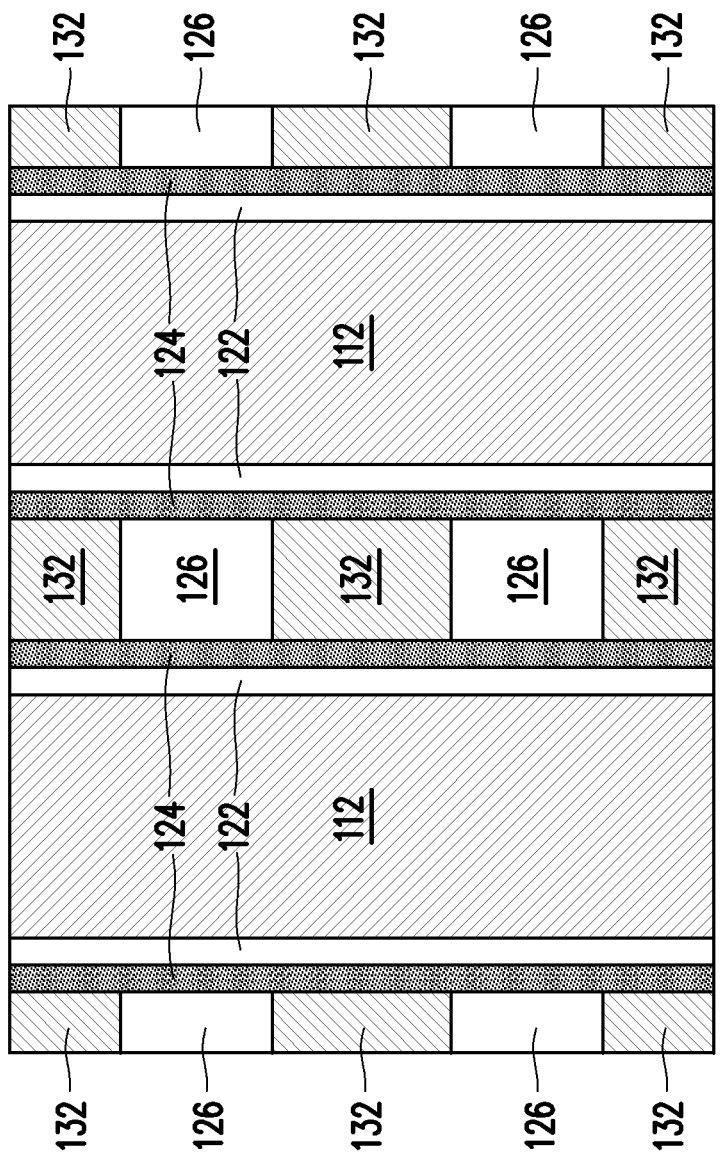

In FIGS. 8A and 8B, conductive lines 132 are formed in the isolation regions 126. The conductive lines 132 may contact the substrate 102. As discussed in greater detail below, the conductive lines 132 are columns that will be divided into bit lines and source lines for the TFTs. The bit lines and the source lines also act as source/drain regions of the TFTs. As such, the conductive lines 132 are formed in contact with the semiconductor strips 124, so that the bit lines and the source lines will adjoin the channel regions 124C.

As an example to form the conductive lines 132, openings for the conductive lines 132 are formed through the isolation regions 126. The openings may be formed with an etching process that is selective to the isolation regions 126 (e.g., selectively removes the material of the isolation regions 126 at a faster rate than the materials of the tunneling strips 122 and the semiconductor strips 124). For example, the openings may be formed through the isolation regions 126 by a dry etch using ammonia ($NH_3$) and hydrogen fluoride (HF) gas, which may be performed using an etching mask 134 having a pattern of the conductive lines 132. The etching mask 134 may include a photoresist, a hardmask, spacers, combinations thereof, or the like, which may be patterned using acceptable photolithography and etching techniques. A liner, such as a diffusion barrier layer, an adhesion layer, or the like, and a main layer are formed in the openings. The liner may be formed of a conductive material such as titanium, titanium nitride, tantalum, tantalum nitride, or the like, which may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The main layer may be formed of a conductive material such as tungsten, cobalt, ruthenium, aluminum, nickel, copper, a copper alloy, silver, gold, or the like, which may be deposited by ALD, CVD, PVD, or the like. In some embodiments, the conductive lines 132 include a liner formed of titanium nitride and a main layer formed of tungsten. A removal process is then applied to the various layers to remove excess material(s) of the conductive lines 132 over the isolation regions 126, the semiconductor strip 124, the tunneling strips 122, and the topmost dielectric layer 106/word line 112. The removal process may be a planarization process such as a chemical mechanical polish (CMP), an etch-back, combinations thereof, or the like. The remaining material(s) form the conductive lines 132 in the openings. The etching mask 134 may be removed during the process for forming the conductive lines 132 (e.g., by the etching process, the removal process, or the like), or may be removed after the conductive lines 132 are formed, such as by acceptable ashing and/or etching process(es).

After the conductive lines 132 are formed, some of the portions of the isolation regions 126 outside of the sidewall recesses 114 (see FIG. 7A) are replaced, but the portions of the isolation regions 126 in the sidewall recesses 114 remain. Thus, portions 126P of the isolation regions 126 are disposed between the conductive lines 132 and the corresponding semiconductor strips 124. The semiconductor strips 124 have first portions (e.g., portions outside of the sidewall recesses 114) contacting the conductive lines 132, and have second portions (e.g., those in the sidewall recesses 114) that are separated from the conductive lines 132 by the portions 126P of the isolation regions 126.

In FIGS. 9A and 9B, isolation regions 142 are formed through the semiconductor strips 124, the isolation regions 126, and the conductive lines 132. The isolation regions 142 divide the semiconductor strips 124 and the conductive lines 132 to form TFTs 68 (see FIG. 9B). Specifically, the conductive lines 132 are divided to form bit lines 144B and source lines 144S. As noted above, the bit lines 144B and the source lines 144S act as source/drain regions of the TFTs 68. After the isolation regions 142 are formed, each TFT 68 includes a portion of a tunneling strip 122, a portion of a semiconductor strip 124, a bit line 144B, and a source line 144S. The isolation regions 142 also extend into portions of the word lines 112 and the tunneling strips 122, but do not divide the word lines 112 or the tunneling strips 122.

As an example to form the isolation regions 142, openings for the isolation regions 142 are formed through the semiconductor strips 124, the isolation regions 126, and the conductive lines 132. The openings also extend into portions of the tunneling strips 122 (such as those portions that extend along the top, bottom, and side surfaces of the word lines 112) and portions of the word lines 112 (such as those portions underlying the removed portions of the tunneling strips 122). Each opening divides a conductive lines 132 into a bit lines 144B and a source line 144S, and also divides two semiconductor strips 124 into four semiconductor strips 124. The openings may be formed with an etching process to remove the conductive and dielectric materials of the layers of the memory cell 52. For example, the openings may be formed by a dry etch using a fluorine-based gas (e.g., $C_4F_6$)

and hydrogen (H$_2$) or oxygen (O$_2$) gas, which may be performed using an etching mask 148 having a pattern of the isolation regions 142. The etching mask 148 may include a photoresist, a hardmask, spacers, combinations thereof, or the like, which may be patterned using acceptable photolithography and etching techniques. The openings may be formed using acceptable photolithography and etching techniques. A dielectric material is then formed in the openings. The dielectric material may be formed of oxides such as silicon oxide, nitrides such as silicon nitride, carbides such as silicon carbide, combinations thereof, or the like, which may be deposited by CVD, ALD, or the like. In some embodiments, the isolation regions 142 are formed of silicon nitride. A removal process is then applied to the various layers to remove excess dielectric material of the isolation regions 142 over the bit lines 144B, the source lines 144S, the isolation regions 142, the isolation regions 126, the semiconductor strip 124, the tunneling strips 122, and the topmost dielectric layer 106/word line 112. The removal process may be a planarization process such as a chemical mechanical polish (CMP), an etch-back, combinations thereof, or the like. The remaining dielectric material forms the isolation regions 142 in the openings. The etching mask 148 may be removed during the process for forming the isolation regions 142 (e.g., by the etching process, the removal process, or the like), or may be removed after the isolation regions 142 are formed, such as by acceptable ashing and/or etching process(es).

The isolation regions 142 each have a width $W_4$ in the first direction $D_1$, which can be in the range of about 38 nm to about 41 nm. The isolation regions 142 may divide the conductive lines 132 into bit lines 144B and source lines 144S of equal or unequal widths. The bit lines 144B each have a width $W_5$ in the first direction $D_1$, which can be in the range of about 38 nm to about 42 nm, and the source lines 144S each have a width $W_6$ in the first direction $D_1$, which can be in the range of about 38 nm to about 42 nm. The width $W_4$ can be greater than, less than, or equal to the width $W_6$. The portions of the isolation regions 126 between the bit lines 144B and the source lines 144S have a width $W_7$ in the first direction $D_1$, which can be in the range of about 90 nm to about 110 nm. The bit lines 144B, the source lines 144S, and the portions of the isolation regions 126 between the bit lines 144B and the source lines 144S each have a width $W_8$ in the second direction $D_2$, which can be in the range of about 35 nm to about 45 nm.

In FIG. 10, an layer dielectric (ILD) 152 is deposited over the bit lines 144B, the source lines 144S, the isolation regions 142, the isolation regions 126, the semiconductor strip 124, the tunneling strips 122, and the topmost dielectric layer 106/word line 112. The ILD 152 may be formed of a dielectric material, and may be deposited by any suitable method, such as CVD, plasma-enhanced CVD (PECVD), FCVD, or the like. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, an etch stop layer is formed between the ILD 152 and the bit lines 144B, the source lines 144S, the isolation regions 142, the isolation regions 126, the semiconductor strip 124, the tunneling strips 122, and the topmost dielectric layer 106/word line 112. The etch stop layer may be formed of a dielectric material, such as silicon nitride, silicon oxide, silicon oxynitride, or the like, having a high etching selectivity from the etching of the ILD 152. The etch stop layer may be formed by any suitable method, such as CVD, ALD, or the like.

Bit line contacts 154 and source line contacts 156 are then formed extending through the ILD 152. Contact openings are formed through the ILD 152. The contact openings may be formed using acceptable photolithography and etching techniques. A liner, such as a diffusion barrier layer, an adhesion layer, or the like, and a conductive material are then formed in the contact openings. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by ALD, CVD, PVD, or the like. A removal process may be performed to remove excess material from the top surface of the ILD 152. The removal process may be a planarization process such as a chemical mechanical polish (CMP), an etch-back, combinations thereof, or the like. The remaining liner and conductive material in the contact openings forms the bit line contacts 154 and the source line contacts 156. The bit line contacts 154 are physically and electrically coupled to the bit lines 144B. The source line contacts 156 are physically and electrically coupled to the source lines 144S.

In FIGS. 11A, 11B, 11C, and 11D, an interconnect structure 160 is formed over the intermediate structure. The interconnect structure 160 may include, e.g., metallization patterns 162 in a dielectric material 164 (not shown in FIG. 11A, see FIGS. 11B, 11C, and 11D). The dielectric material 164 may include one or more dielectric layers, such as one or more layers of a low-k (LK) or an extra low-K (ELK) dielectric material. The metallization patterns 162 may be metal interconnects (e.g., conductive lines, conductive vias, etc.) formed in the one or more dielectric layers. The interconnect structure 160 may be formed by a damascene process, such as a single damascene process, a dual damascene process, or the like. The metallization patterns 162 of the interconnect structure 160 are electrically connected to the bit lines 144B (through the bit line contacts 154) and the source lines 144S (through the source line contacts 156), and interconnect the TFTs 68 to form functional memories.

As shown in FIGS. 11C and 11D, the bit lines 144B and the source lines 144S are formed in an alternating pattern. Forming the bit lines 144B and the source lines 144S in an alternating pattern helps avoid shorting of adjacent bit lines 144B/source lines 144S in the cross-section of FIG. 11C when a word line 112 is activated.

Figure 12A:
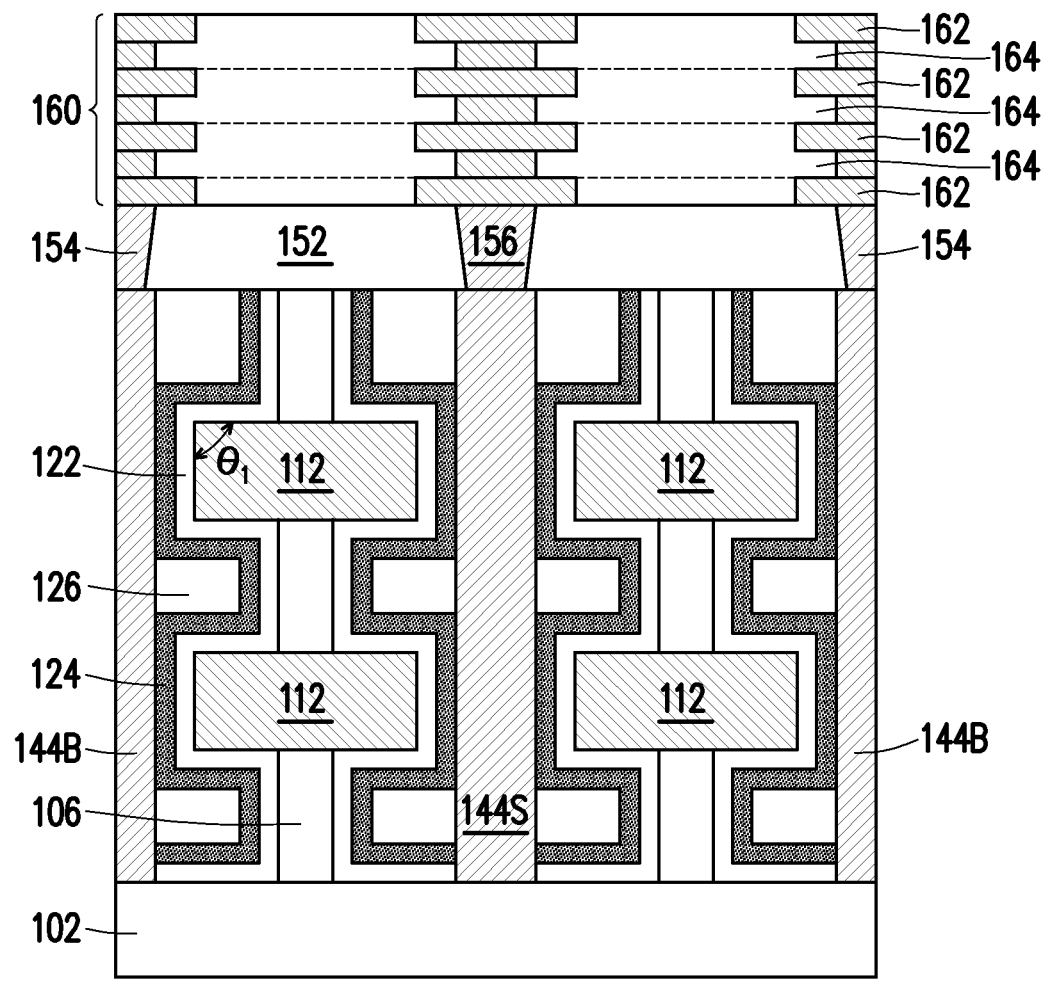
FIGS. 12A, 12B, and 12C are views of memory arrays, in accordance with various embodiments.
Figure 12B:
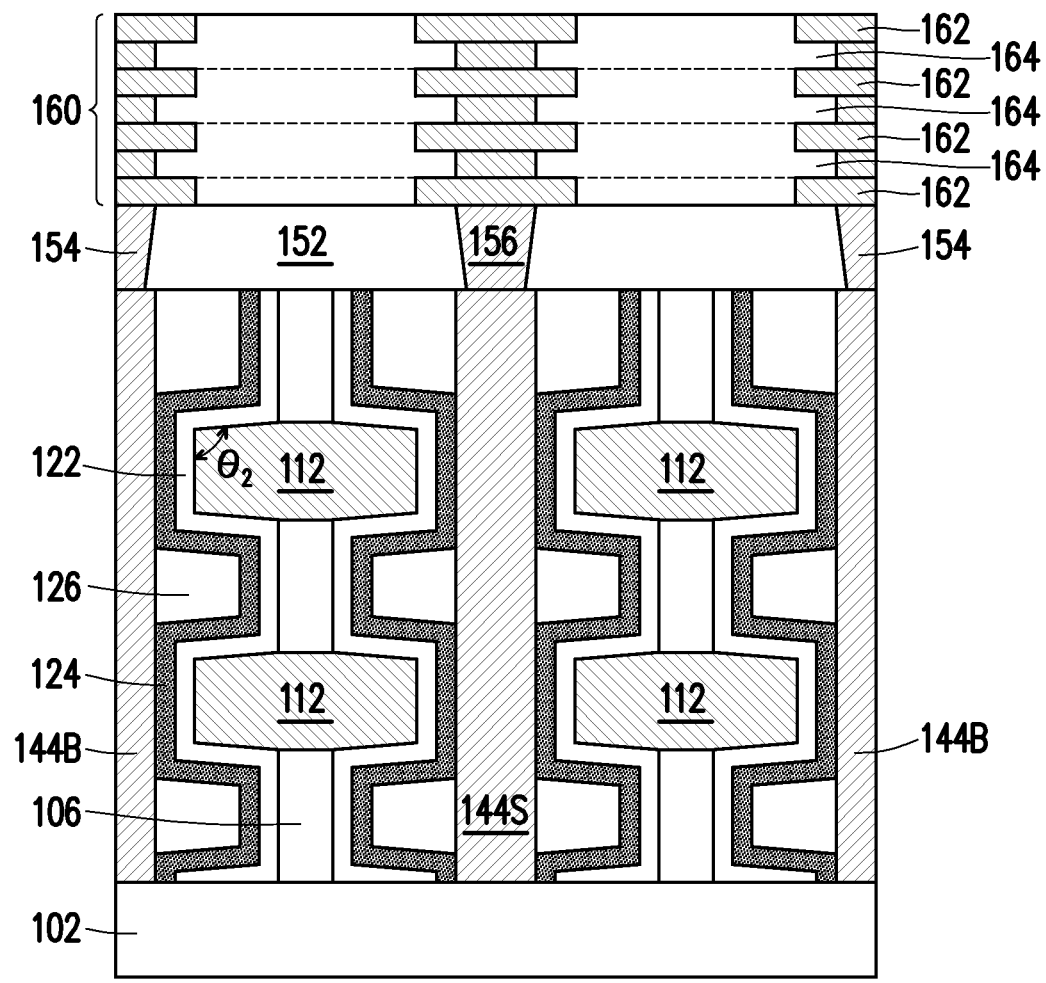
Figure 12C:
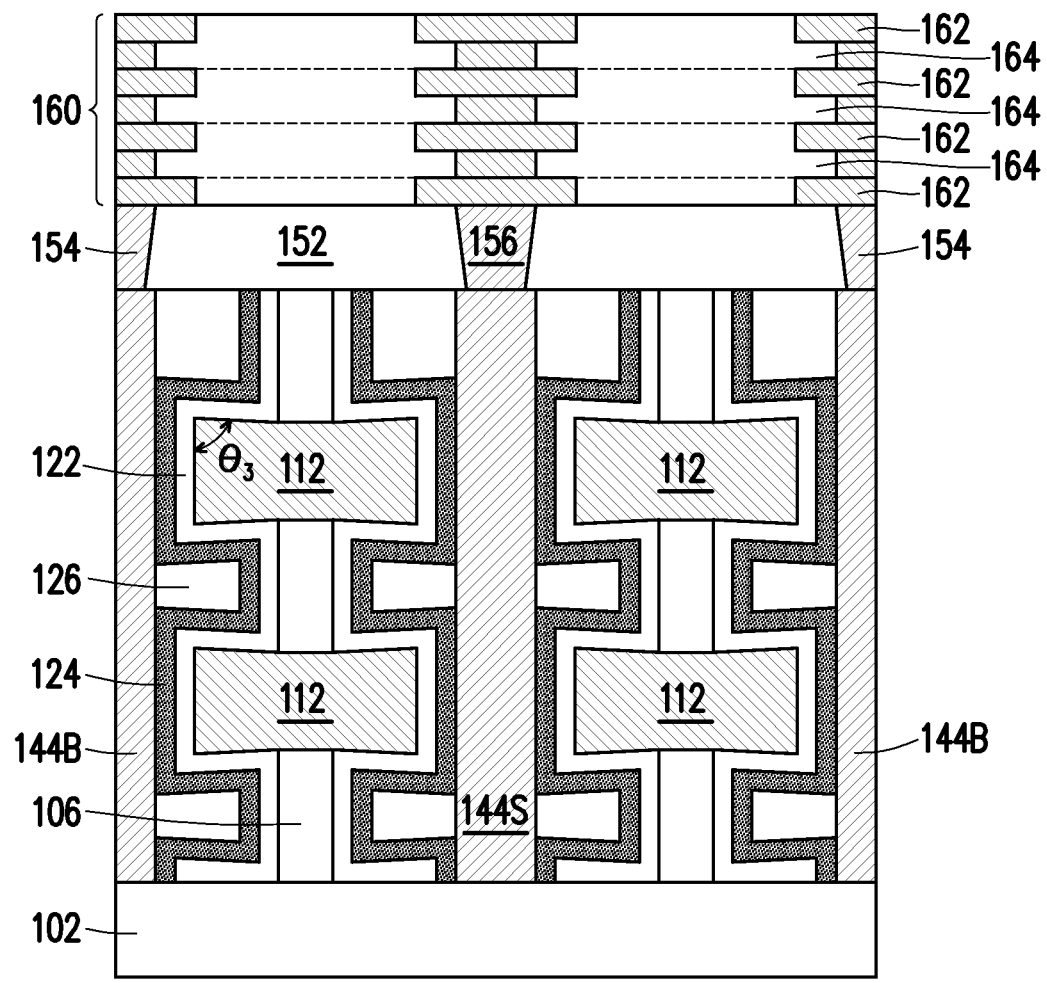

FIGS. 12A, 12B, and 12C are cross-sectional views of memory arrays 52, in accordance with various embodiments. FIGS. 12A, 12B, and 12C are shown along reference cross-section C-C in FIG. 11A. Word lines 112 of different profile shapes are shown. The profile shapes of the word lines 112 may be determined by the etching selectivity between the material of the dielectric layers 106 and the material of the word lines 112 during the etching process used to form the sidewall recesses 114 (see FIG. 6).

In FIG. 12A, the word lines 112 have quadrilateral profile shapes. The sidewall of each word line 112 forms a right angle $\theta_1$ with the top and bottom surface of the word line 112. The word lines 112 can be formed with quadrilateral profile shapes by recessing the sidewalls of the dielectric layers with an etching process having a high etching selectivity between the dielectric layers 106 and the word lines 112, such as an etching process that selectively removes the material of the dielectric layers 106 from about 5 to about 8 times faster than the materials of the word lines 112.

In FIG. 12B, the word lines 112 have tapered profile shapes. The sidewall of each word line 112 forms an obtuse angle $\theta_2$ with the top and bottom surface of the word line 112. The angle $\theta_2$ is greater than 90 degrees, such as in the range of about 92 degrees to about 98 degrees. The word lines 112 can be formed with tapered profile shapes by recessing the sidewalls of the dielectric layers with an etching process having a high etching selectivity between the dielectric layers 106 and the word lines 112, such as an etching process that selectively removes the material of the dielectric layers 106 from about 5 to about 8 times faster than the materials of the word lines 112.

In FIG. 12C, the word lines 112 have flared profile shapes. The sidewall of each word line 112 forms an acute angle $\theta_3$ with the top and bottom surface of the word line 112. The angle $\theta_3$ is less than 90 degrees, such as in the range of about 85 degrees to about 89 degrees. The word lines 112 can be formed with flared profile shapes by recessing the sidewalls of the dielectric layers with an etching process having a high etching selectivity between the dielectric layers 106 and the word lines 112, such as an etching process that selectively removes the material of the dielectric layers 106 from about 5 to about 8 times faster than the materials of the word lines 112.

The word lines 112 of FIGS. 12A, 12B, and 12C have sharp corner shapes. Sharp corner shapes are those formed by an arc having a length of less than about 3% of the thickness of the word lines 112, such as an arc length in the range of about 1.2 nm to about 1.5 nm. The corner shapes of the word lines 112 may be determined by the lateral etching rate of the etching process used to form the sidewall recesses 114 (see FIG. 6). The word lines 112 can be formed with sharp corner shapes by recessing the dielectric layers 106 with an etching process having a lateral etch rate in the range of about 2 μm/min to about 2.5 μm/minute.

Figure 13A:
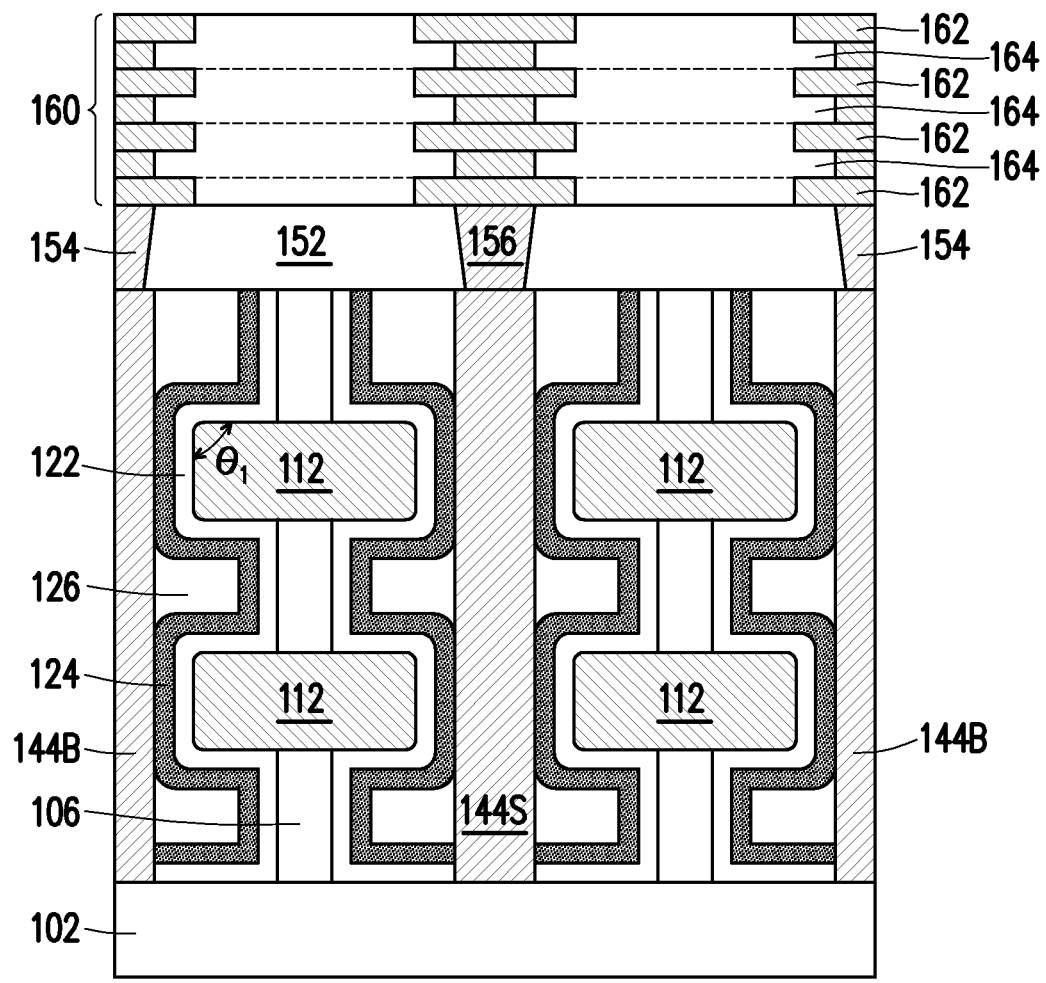
FIGS. 13A, 13B, and 13C are views of memory arrays, in accordance with various embodiments.
Figure 13B:
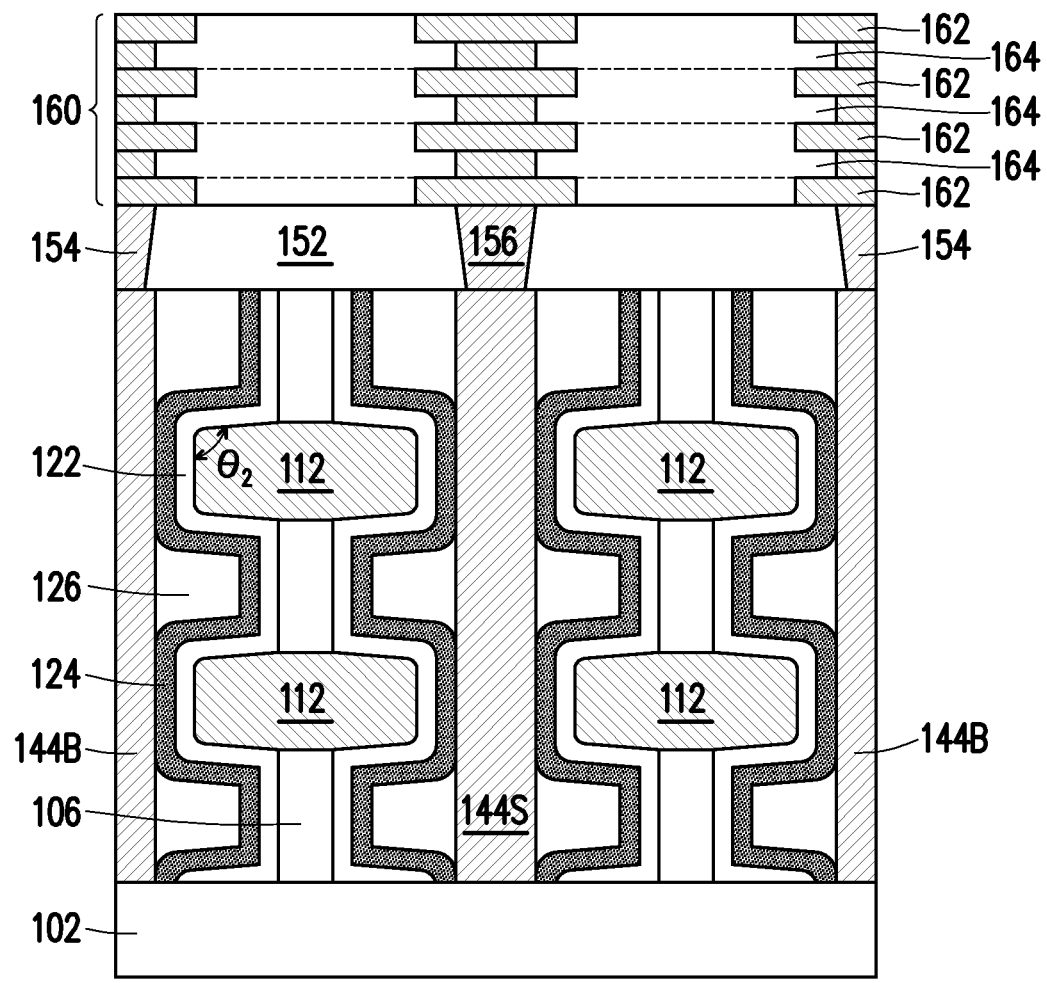
Figure 13C:
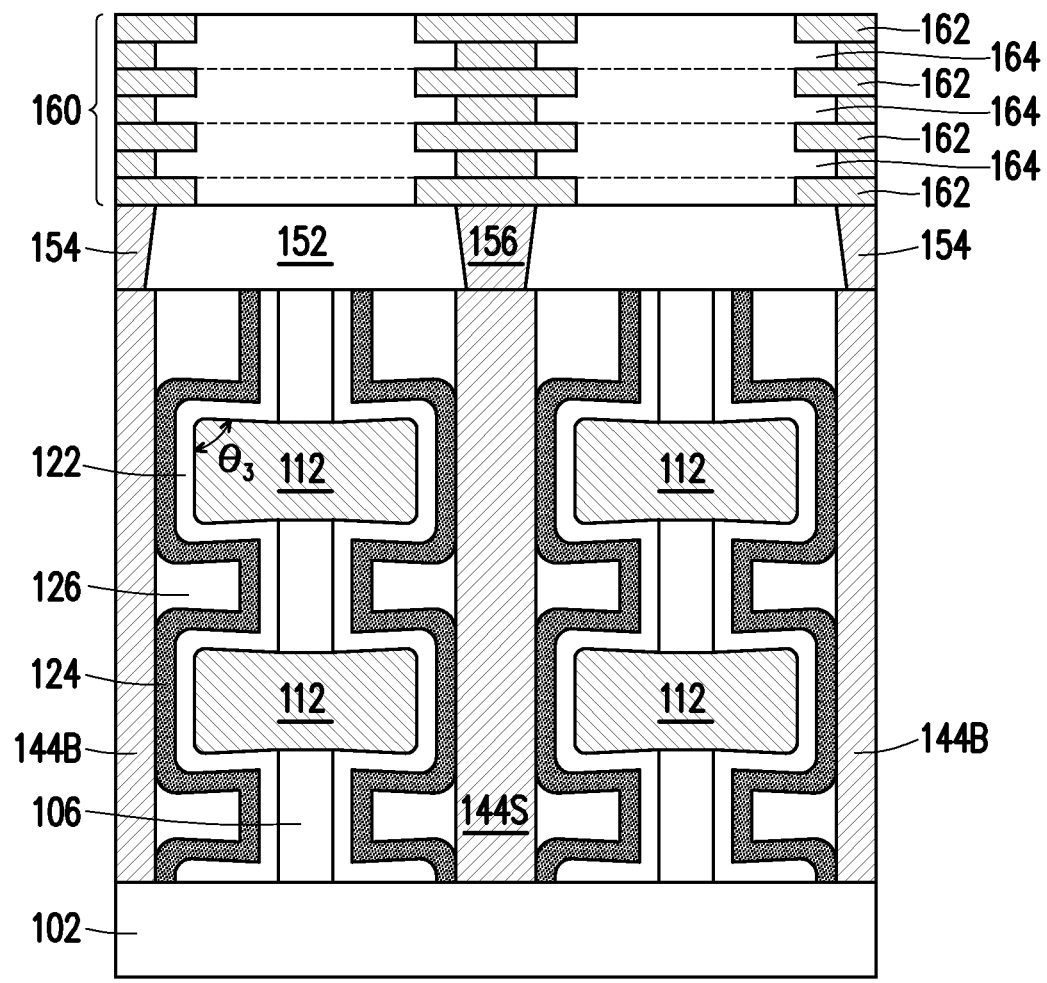

FIGS. 13A, 13B, and 13C are cross-sectional views of memory arrays 52, in accordance with various embodiments. FIGS. 13A, 13B, and 13C are shown along reference cross-section C-C in FIG. 11A. The embodiments shown in FIGS. 13A, 13B, and 13C are similar to the embodiments shown in FIGS. 12A, 12B, and 12C, respectively, except the word lines 112 have rounded corner shapes. Rounded corner shapes are those formed by an arc having a length of greater than about 3% of the thickness of the word lines 112, such as a length in the range of about 1.2 nm to about 1.5 nm. The word lines 112 can be formed with rounded corner shapes by recessing the dielectric layers 106 with an etching process having a lateral etch rate in the range of about 2 μm/min to about 2.5 μm/minute.

Figure 15:
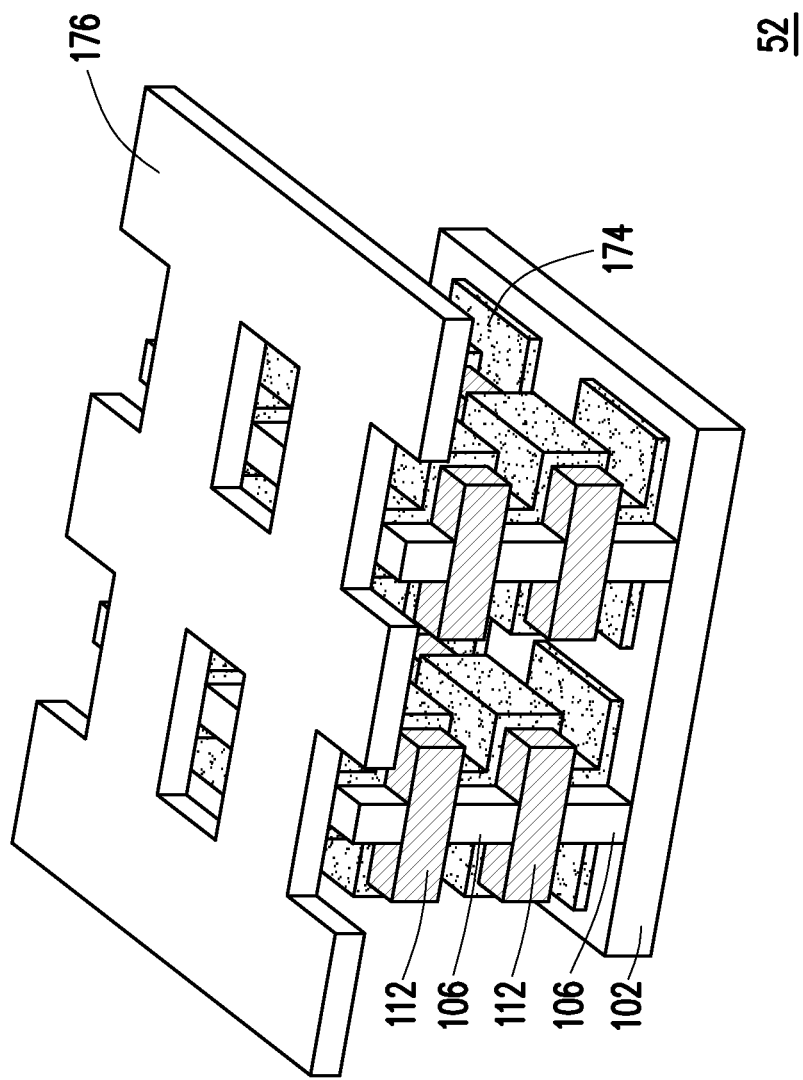
Figure 16A:
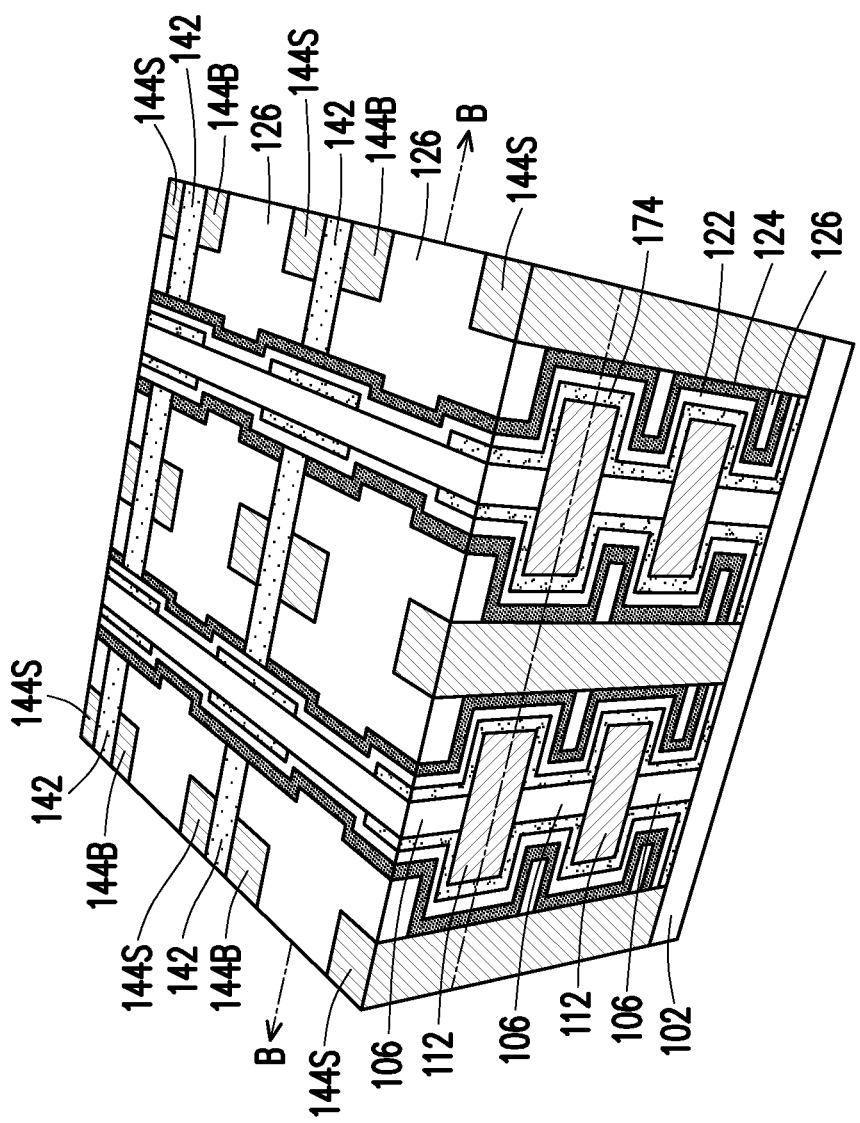
Figure 16B:
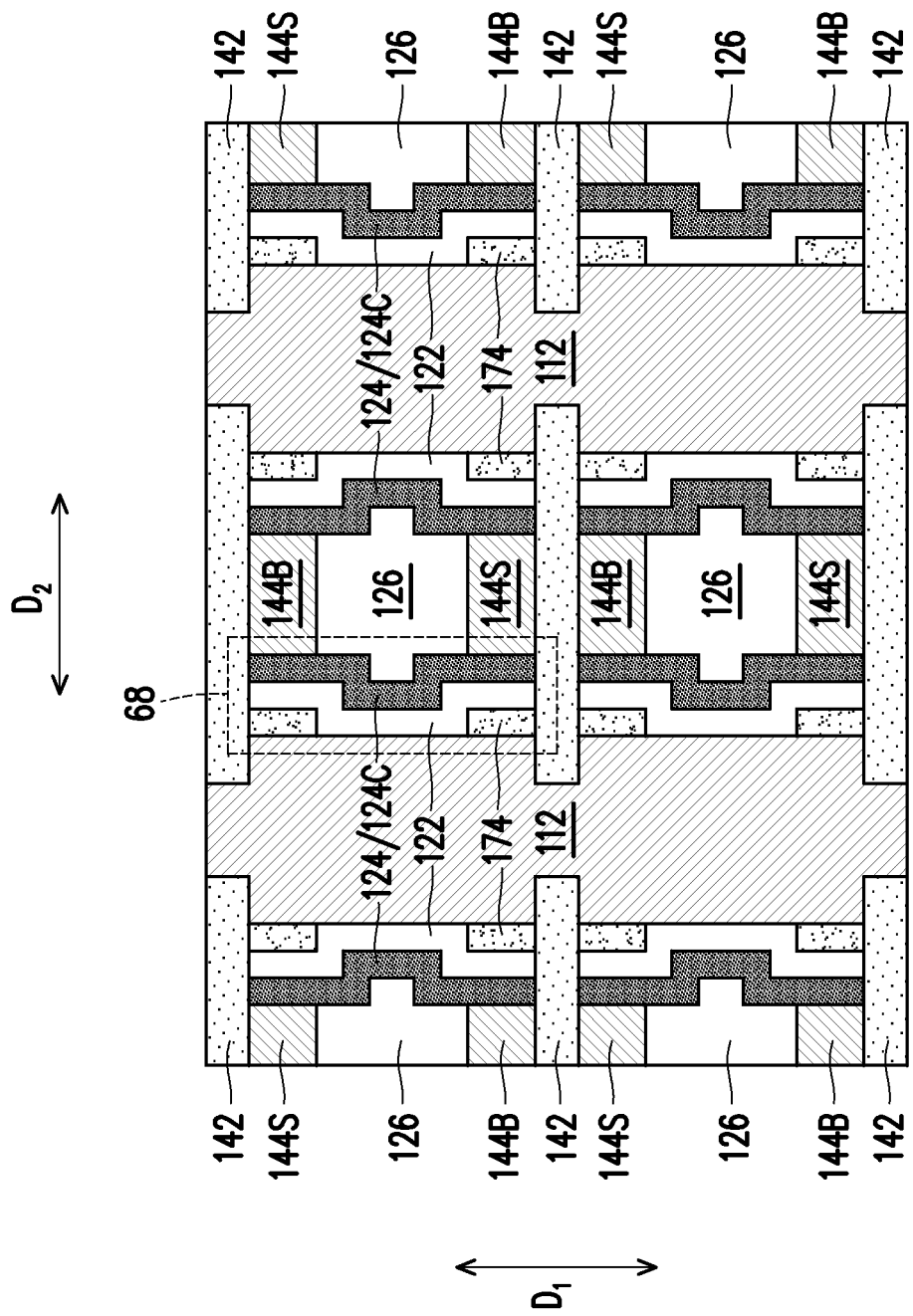
Figure 17A:
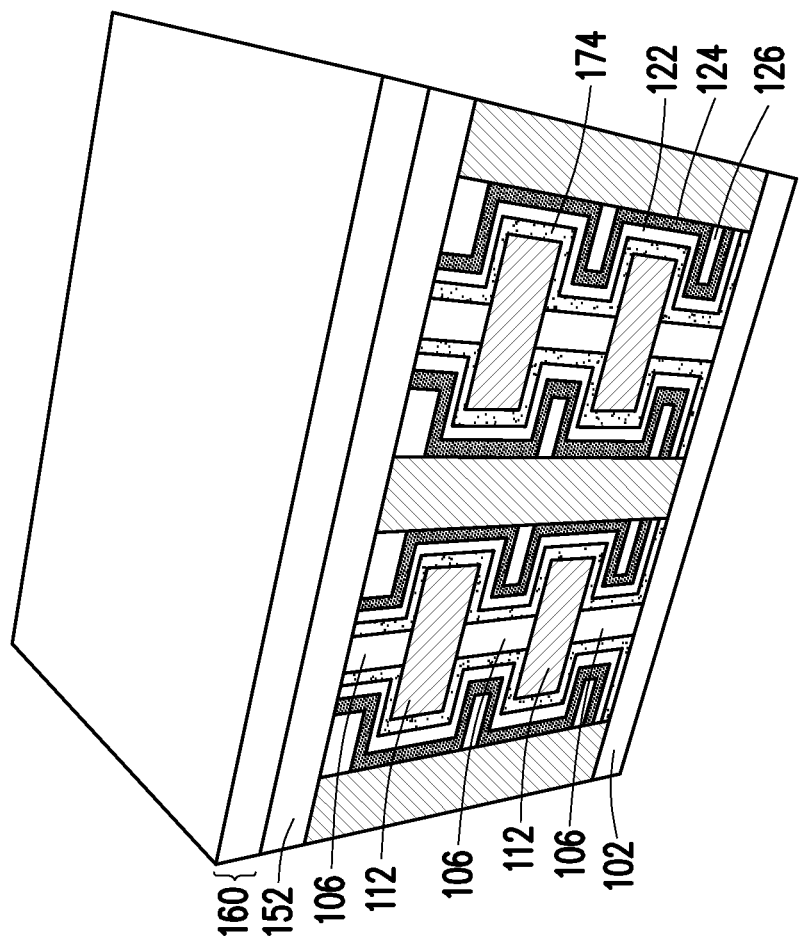
Figure 17B:
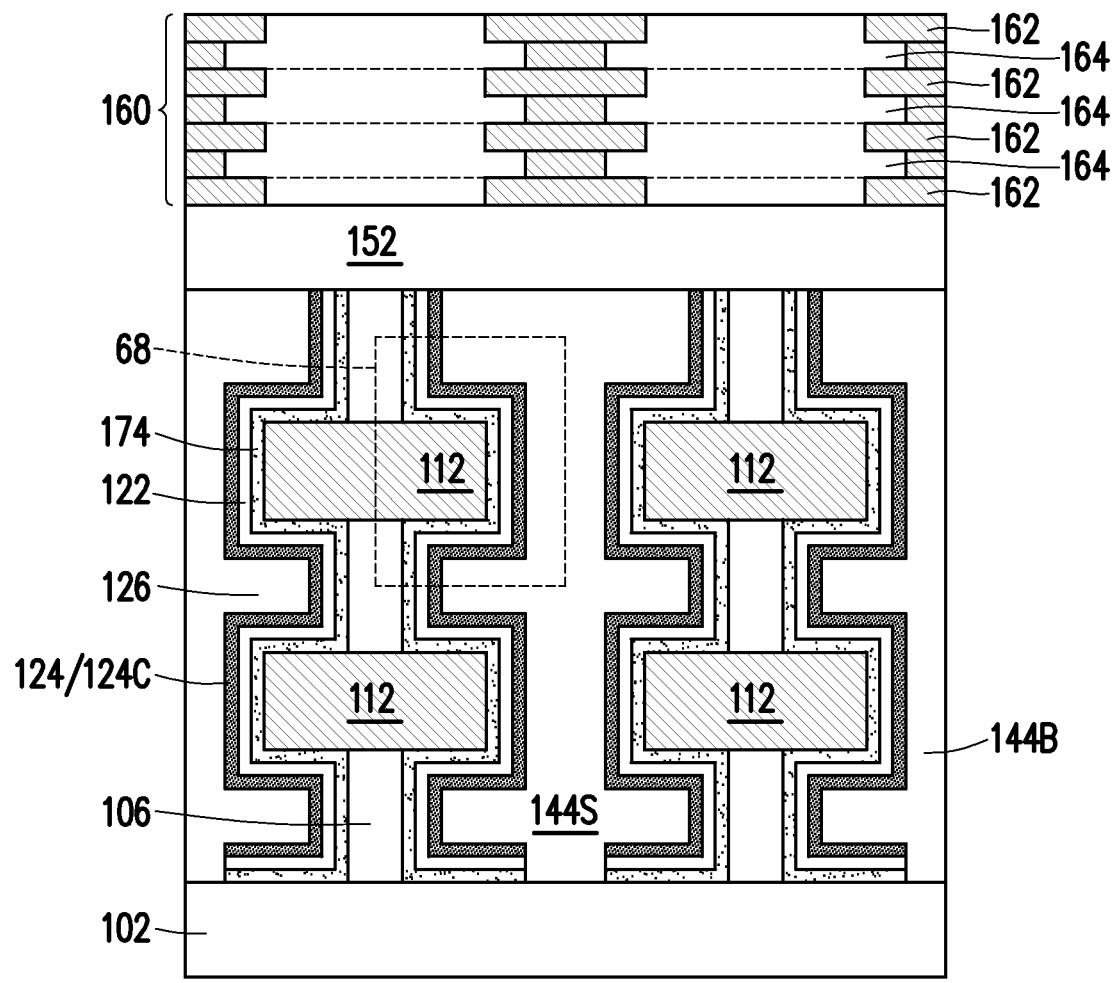
Figure 17C:
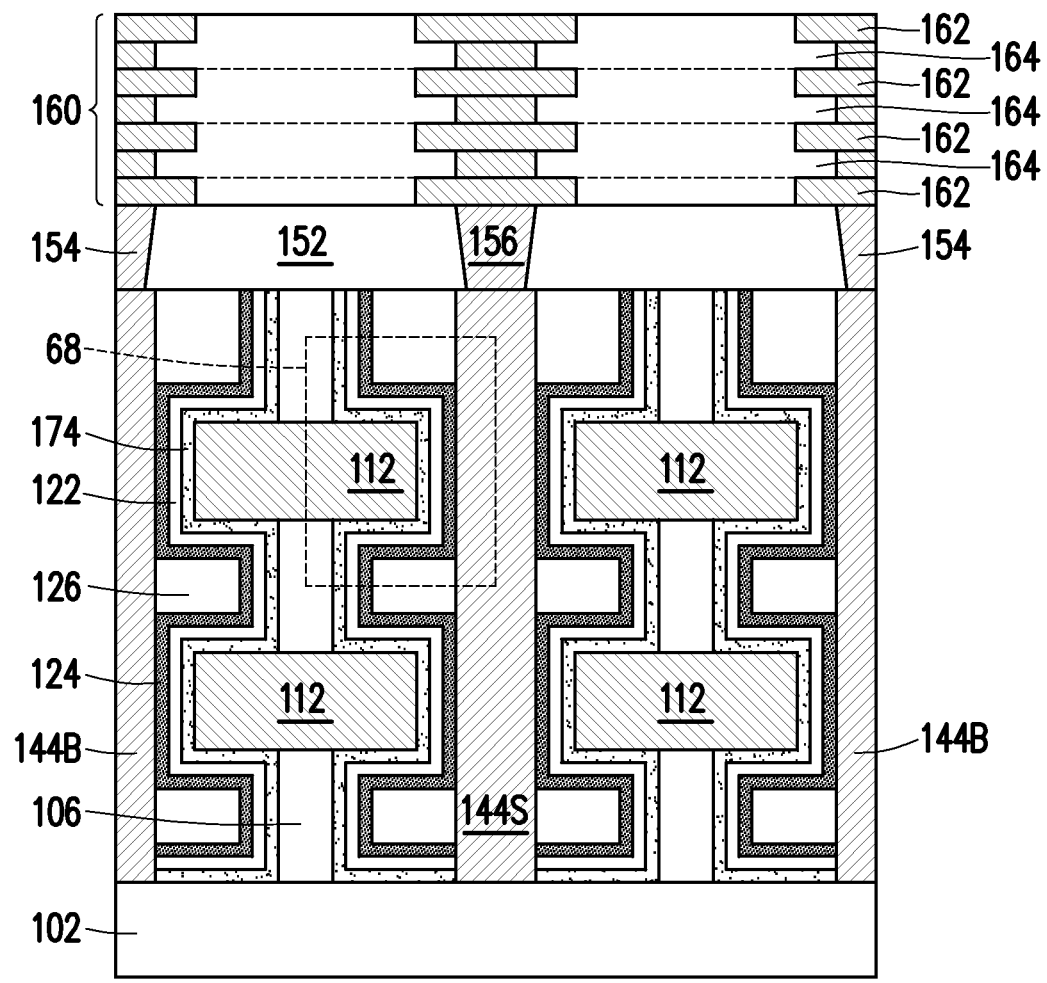

FIGS. 14 through 17C are various views of intermediate stages in the manufacturing of a memory array 52, in accordance with some other embodiments. FIGS. 14, 15, 16A, and 17A are three-dimensional views. FIG. 16B is a cross-sectional view showing a similar cross-section as FIG. 9B. FIGS. 17B and 17C are cross-sectional views showing similar cross-section as FIGS. 11B and 11C. Some features, such as the staircase arrangement of the word lines (see FIG. 2B), are not shown for clarity of illustration. In this embodiment, isolation strips are formed between the tunneling strips 122 and the word lines 112, which can help reduce parasitic capacitance of the TFTs.

Figure 14:
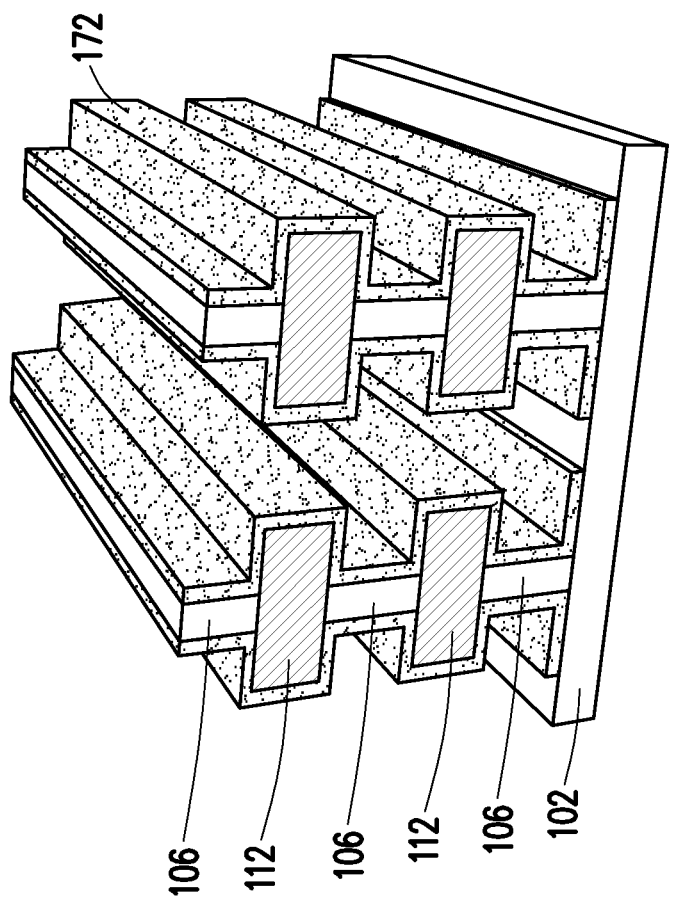
FIGS. 14 through 17C are various views of intermediate stages in the manufacturing of a memory array 52, in accordance with some other embodiments.

In FIG. 14, a structure similar to that described with respect to FIG. 6 is formed or obtained. An isolation layer 172 is then conformally deposited in the trenches 110 and the sidewall recesses 114. Specifically, the isolation layer 172 extends along the sidewalls of the word lines 112, the recessed sidewalls of the dielectric layers 106, and the top and bottom surfaces of the word lines 112 exposed by the sidewall recesses 114. The isolation layer 172 may be formed of a dielectric material. The dielectric material may be formed of oxides such as silicon oxide, nitrides such as silicon nitride, carbides such as silicon carbide, combinations thereof, or the like, which may be deposited by CVD, ALD, or the like. In some embodiments, the isolation layer 172 is silicon oxide or aluminum oxide deposited by ALD. The isolation layer 172 can have a thickness in the range of about 9 nm to about 10 nm.

In FIG. 15, the isolation layer 172 is patterned to form isolation strips 174. The isolation layer 172 may be patterned with an etching process that is selective to the isolation layer 172 (e.g., selectively removes the material of the isolation layer 172 at a faster rate than the materials of the dielectric layers 106 and the word lines 112). For example, the openings may be formed through the isolation layer 172 by a dry etch using ammonia ($NH_3$) and hydrogen fluoride (HF) gas, which may be performed using an etching mask 176 having a pattern of the isolation strips 174. The etching mask 176 may include a photoresist, a hardmask, spacers, combinations thereof, or the like, which may be patterned using acceptable photolithography and etching techniques. The etching mask 176 may be removed during the process for forming the isolation strips 174 (e.g., by the etching process), or may be removed after the isolation strips 174 are formed, such as by acceptable ashing and/or etching process(es).

In FIGS. 16A and 16B, the tunneling strips 122, the semiconductor strips 124, the isolation regions 126, the isolation regions 142, the bit lines 144B, and the source lines 144S are formed using similar processes as those described with respect to FIGS. 7A through 9B. After formation, the tunneling strips 122 contact some portions of the word lines 112, and the isolation strips 174 contact other portions of the word lines 112. In other words, the tunneling strips 122 are formed on the isolation strips 174 and portions of the word lines 112. The bit lines 144B and the source lines 144S are formed directly adjacent to the isolation strips 174. In other words, each isolation strip 174 is disposed between a column of word lines 112 and a respective one of a bit line 144B or a source line 144S. The isolation strips 174 increase the amount of electrical isolation between the word lines 112 and the bit lines 144B/source lines 144S, reducing the parasitic capacitance on the channel regions 124C of the TFTs 68. Decreasing the parasitic capacitance of the TFTs 68 can help improve the read speed of the memory array 52.

In FIGS. 17A through 17C, an interconnect structure 160 is formed over the intermediate structure. The interconnect structure 160 may be formed using a similar process as that described with respect to FIGS. 11A, 11B, 11C, and 11D.

Figure 18A:
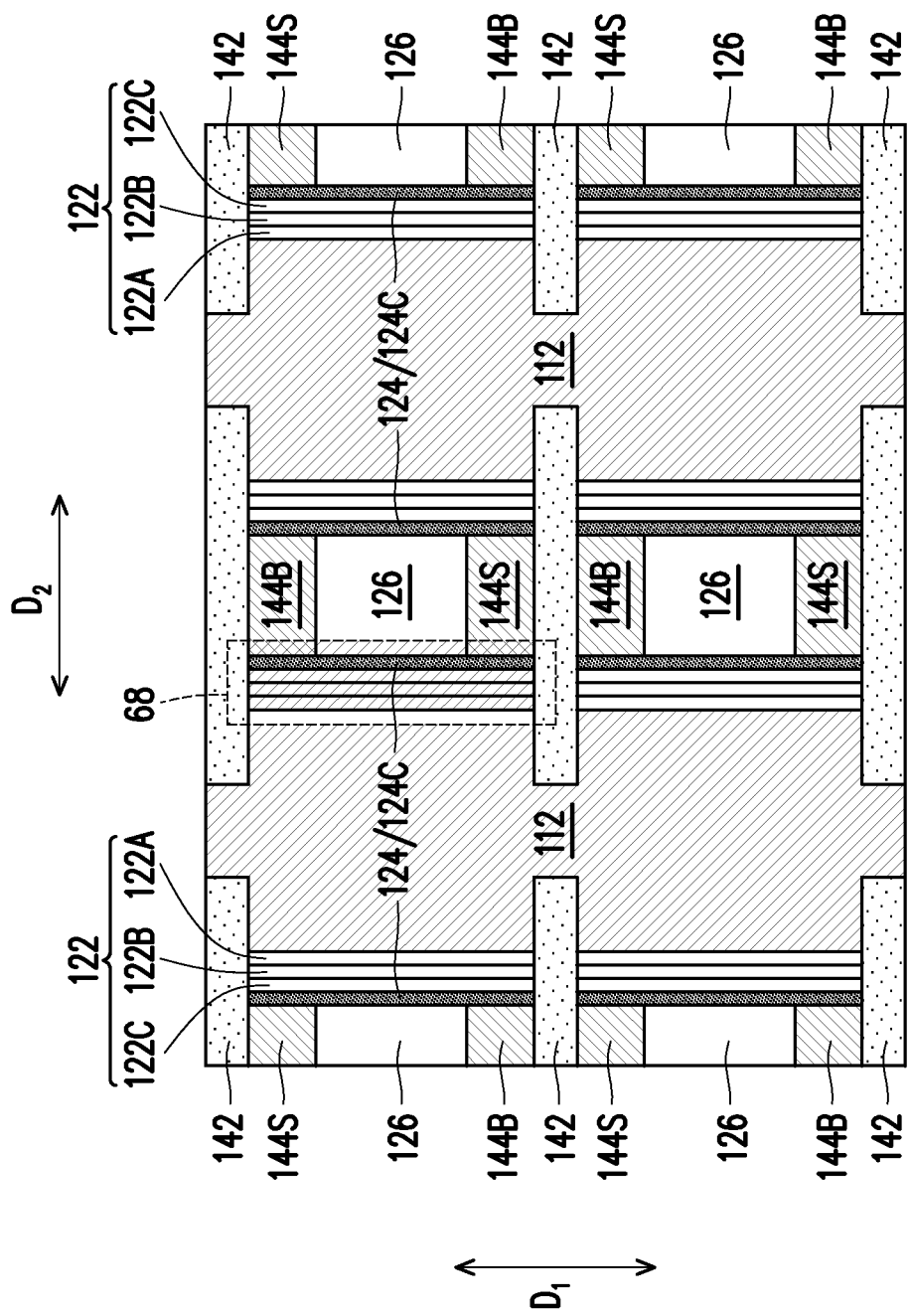
FIGS. 18A through 18C are various views of a memory array, in accordance with some other embodiments.
Figure 18B:
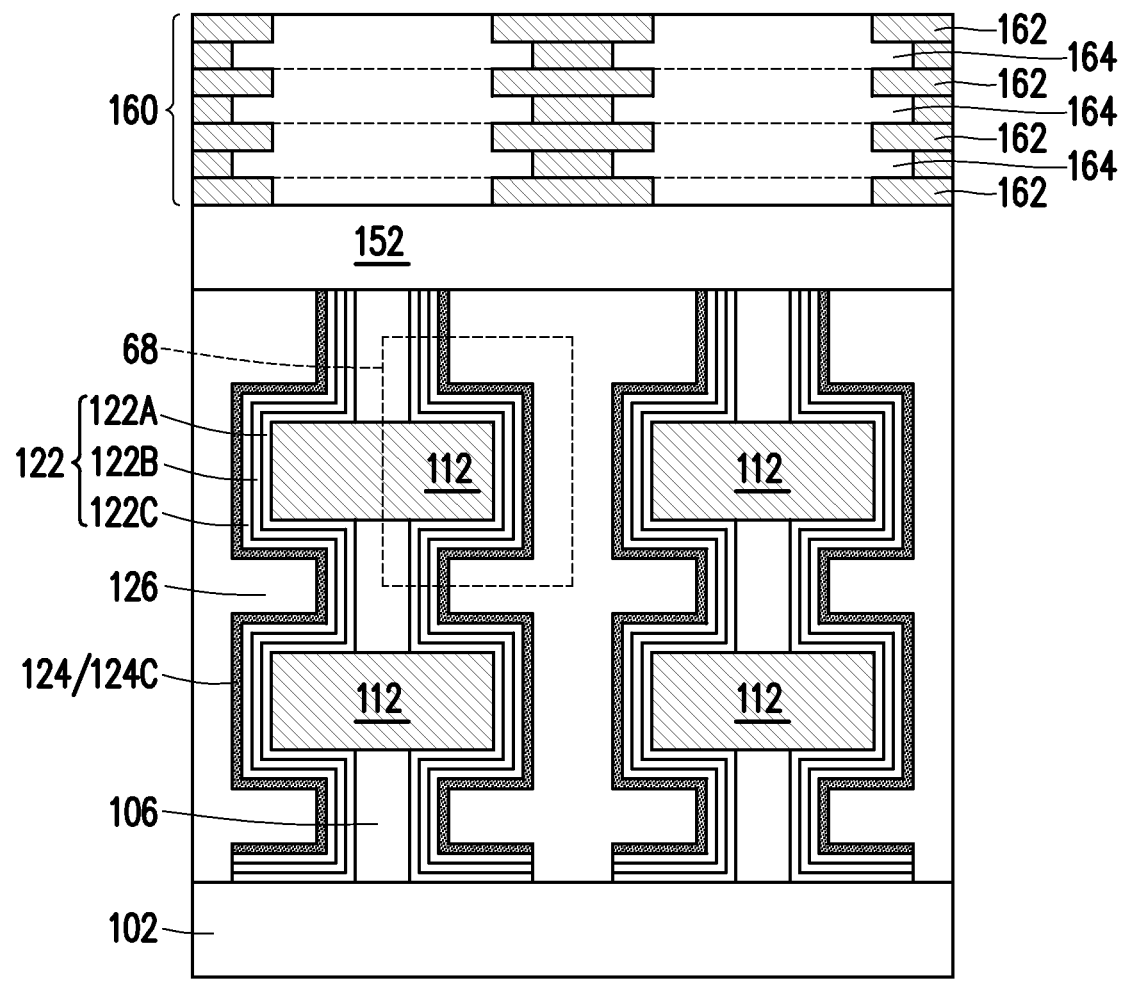
Figure 18C:
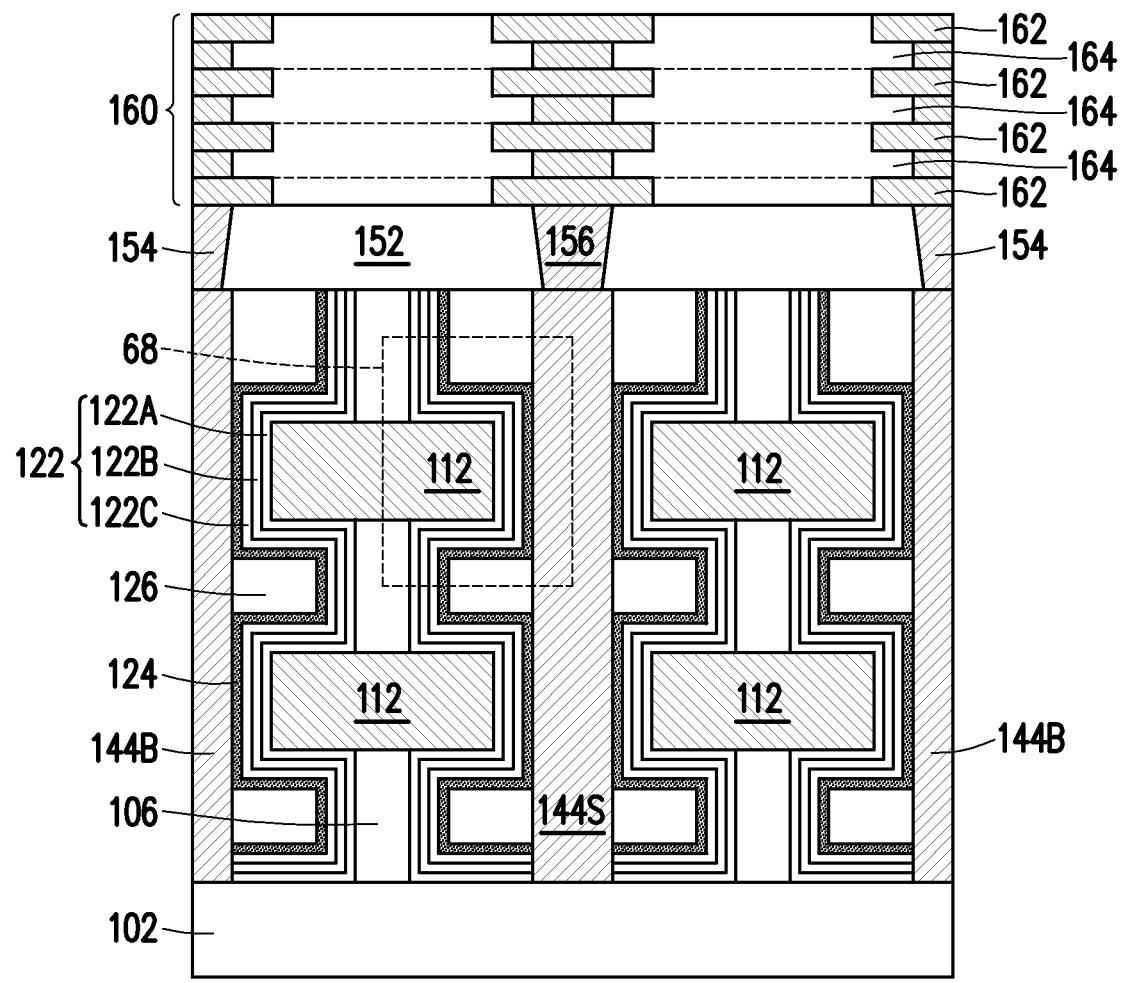

FIGS. 18A through 18C are various views of a memory array 52, in accordance with some other embodiments. FIG. 18A is a cross-sectional view showing a similar cross-section as FIG. 9B. FIGS. 18B and 18C are cross-sectional views showing similar cross-section as FIGS. 11B and 11C. Some features, such as the staircase arrangement of the word lines (see FIG. 2B), are not shown for clarity of illustration. In this embodiment, the tunneling strips 122 include a low-k dielectric material. Specifically, the tunneling strips 122 include a plurality of low-k dielectric layers 122A, 122B, 122C instead of a high-k ferroelectric layer.

The first dielectric layers 122A are formed on the substrate 102 and in contact with the sidewalls of the dielectric layers 106 and the word lines 112. The second dielectric layers 122B are formed on the first dielectric layers 122A. The third dielectric layers 122C are formed on the second dielectric layers 122B. In some embodiments, the first dielectric layers 122A and the third dielectric layers 122C are formed of a first dielectric material (e.g., an oxide such as silicon oxide) and the second dielectric layers 122B are formed of a different second dielectric material (e.g., a nitride such as silicon nitride). The first dielectric layers 122A, the second dielectric layers 122B, and the third dielectric layers 122C may be formed by a combination of deposition, etching, and planarization, in a similar manner as that discussed above with respect to the high-k tunneling strips 122. In some embodiments, the dielectric layers 122A, 122B, 122C are layers for floating gate transistors. For example, the dielectric layers 122A can be blocking layers, the dielectric layers 122B can be trapping layers, and the dielectric layers 122C can be tunneling layers.

The embodiments of FIGS. 14 through 18C are illustrated with word lines 112 having quadrilateral profile shapes and sharp corner shapes (similar to those described with respect to FIG. 12A). It should be appreciated that the embodiments of FIGS. 14 through 18C may be formed with word lines 112 having tapered profile shapes or flared profile shapes, and may be formed with word lines 112 having rounded corner shapes.

In the embodiments described with respect to FIGS. 3 through 18C, the memory array 52 is formed over a substrate 102, such as a dielectric substrate. In some embodiments, the memory array 52 is formed as part of a standalone device (e.g., a memory die), which is integrated with other devices (e.g., a logic die) through device packaging. In some embodiments, the memory array 52 is embedded in another device, such as a logic die. In such embodiments, the substrate 102 may be omitted, or may be an underlying layer, such as an underlying dielectric layer, an underlying semiconductor substrate, or the like.

Figure 19:
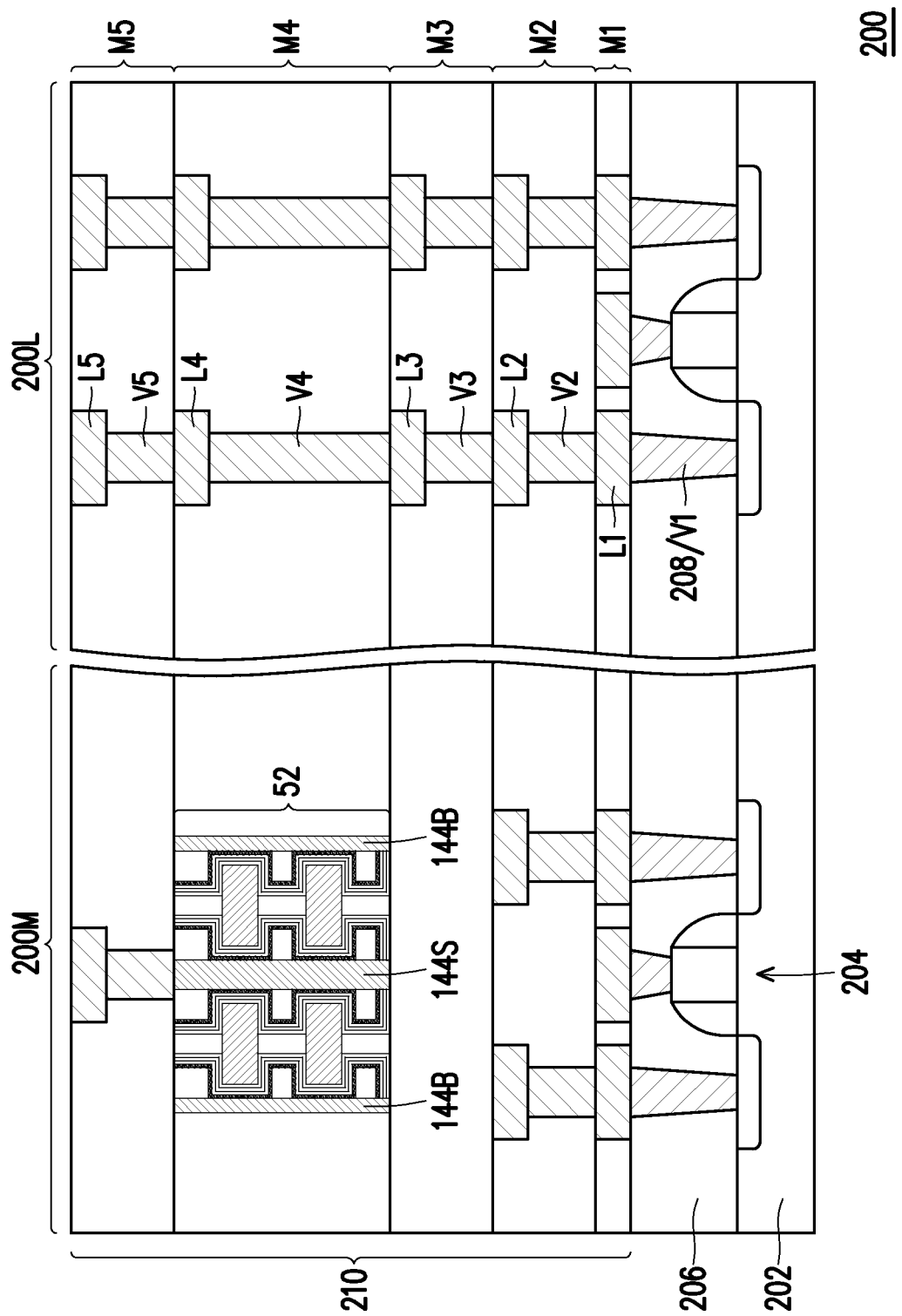
FIG. 19 is a cross-sectional view of a semiconductor device, in accordance with some embodiments.

FIG. 19 is a cross-sectional view of a semiconductor device 200, in accordance with some embodiments. FIG. 19 is a simplified view, and some features are omitted for clarity of illustration. The semiconductor device 200 includes a logic region 200L and a memory region 200M. Memory devices (e.g., flash memories) are formed in the memory region 200M and logic devices (e.g., logic circuits) are formed in the logic region 200L. For example, a memory array 52 (see FIG. 1) can be formed in the memory region 200M, and the row decoder 54 and the column decoder 56 (see FIG. 1) can be formed in the logic region 200L. The memory region 200M can be disposed at an edge of the logic region 200L, or the logic region 200L can surround the memory region 200M.

The logic region 200L and the memory region 200M are formed over a same semiconductor substrate 202. The semiconductor substrate 202 may be silicon, doped or undoped, or an active layer of a semiconductor-on-insulator (SOI) substrate. The semiconductor substrate 202 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 204 are formed at the active surface of the semiconductor substrate 202. The devices 204 may be active devices or passive devices. For example, the electrical components may be transistors, diodes, capacitors, resistors, or the like, formed by any suitable formation method. The devices 204 are interconnected to form the memory devices and logic devices of the semiconductor device 200.

One or more inter-layer dielectric (ILD) layer(s) 206 are formed on the semiconductor substrate 202, and electrically conductive features, such as contact plugs 208, are formed electrically connected to the devices 204. The ILD layer(s) 206 may be formed of any suitable dielectric material, for example, an oxide such as silicon oxide, phosphosilicate glass (PSG), borosilicate glass (BSG), boron-doped phosphosilicate glass (BPSG), or the like; nitride such as silicon nitride; or the like. The ILD layer(s) may be formed by any acceptable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 210 is formed over the semiconductor substrate 202. The interconnect structure 210 interconnects the devices 204 to form integrated circuits in each of the logic region 200L and memory region 200M. The interconnect structure 210 includes multiple metallization layers M1-M5. Although five metallization layers are illustrated, it should be appreciated that more or less metallization layers may be included. Each of the metallization layers M1-M5 includes metallization patterns in dielectric layers. The metallization patterns are connected to the devices 204 of the semiconductor substrate 202, and include, respectively, metal lines L1-L5 and metal vias V1-V5 formed in one or more inter-metal dielectric (IMD) layers. The interconnect structure 210 may formed by a damascene process, such as a single damascene process, a dual damascene process, or the like. In some embodiments, the contact plugs 208 are also part of the metallization patterns, such as part of the lowest layer of metal vias V1.

In this embodiment, the memory array 52 is formed in the interconnect structure 210. The memory array 52 can be formed in any of the metallization layers M1-M5, and is illustrated as being formed in an intermediate metallization layer M4, although it could also be formed in lower metallization layers M1-M3 or an upper metallization layer M5. The memory array 52 is electrically connected to the devices 204. In this embodiment, a metallization layer overlying the memory array 52 (e.g., the metallization layer M5) contains interconnects to the bit lines 144B and the source lines 144S. In another embodiment, a metallization layer underlying the memory array 52 (e.g., the metallization layer M3) contains interconnects to the bit lines 144B and the source lines 144S.

In some embodiments, the interconnect structure 210 may be formed by first forming the layers underlying the memory array 52, e.g., the metallization layers M1-M3. The memory array 52 can then be formed on the metallization layer M3, with the substrate 102 being an etch stop layer on the IMD of the metallization layer M3. After formation of the memory array 52, the remainder of the metallization layer M4 can be formed, such as by depositing and planarizing the IMD for the metallization layer M4, and then forming metal lines M4 and metal vias M4. The layers (if any) overlying the memory array 52, e.g., the metallization layer M5, can then be formed.

Embodiments may achieve advantages. Each word line 112 can be formed with a fin-like structure by laterally recessing the dielectric layers 106 before forming the film stacks for the TFTs 68. Word lines 112 with fin-like structures have three-dimensional channel regions 124C. Forming TFTs 68 with three-dimensional channel regions may allow the performance of the TFTs 68 to be improved. For example, three-dimensional channel regions can produce greater electric fields with lower gate voltages than planar channel regions. Flash memory arrays suitable for applications that demand high performing memories (e.g., artificial intelligence, high-performance computing, etc.) may thus be formed. Further, forming memory arrays with three-dimensional channel regions may allow the average size of devices (e.g., TFTs) in the memory arrays to be reduced while the channel regions maintain sufficient performance. The density of flash memories may thus be improved.

In an embodiment, a method includes: forming a word line between a pair of dielectric layers; recessing sidewalls of the dielectric layers from a sidewall of the word line to expose a top surface and a bottom surface of the word line; forming a tunneling strip on the sidewalls of the dielectric layers and the top surface, the bottom surface, and the sidewall of the word line; forming a semiconductor strip on the tunneling strip; and forming a bit line and a source line contacting the semiconductor strip.

In some embodiments, the method further includes: forming a trench in a multilayer stack, the multilayer stack including the dielectric layers, where recessing the sidewalls of the dielectric layers expands the trench to form sidewall recesses, the tunneling strip and the semiconductor strip each extending into the sidewall recesses; and depositing a first isolation region in the trench and the sidewall recesses. In some embodiments of the method, forming the bit line and the source line includes: replacing a first portion of the first isolation region outside of the sidewall recesses with a conductive line, a second portion the first isolation region remaining in the sidewall recesses; and forming a second isolation region dividing the conductive line into the bit line and the source line. In some embodiments of the method, the multilayer stack further includes a sacrificial layer between the dielectric layers, and forming the word line includes: replacing the sacrificial layer with the word line. In some embodiments of the method, recessing the sidewalls of the dielectric layers includes: etching the dielectric layers with an etching process, the etching process removing a dielectric material of the dielectric layers at a faster rate than a conductive material of the word line. In some embodiments of the method, the etching process reduces widths of the dielectric layers by 60% to 80%. In some embodiments of the method, the etching process includes a wet etch performed with dilute hydrofluoric acid, the wet etch forming sidewall recesses, the sidewall recesses each have a depth in a range of 30 nm to 40 nm. In some embodiments of the method, the tunneling strip contacts the sidewalls of the dielectric layers and the top surface, the bottom surface, and the sidewall of the word line. In some embodiments, the method further includes: forming an isolation strip contacting the sidewalls of the dielectric layers and the top surface, the bottom surface, and the sidewall of the word line, the isolation strip disposed between the tunneling strip and the word line.

In an embodiment, a device includes: a pair of dielectric layers; a word line between the dielectric layers, sidewalls of the dielectric layers being recessed from a sidewall of the word line; a tunneling strip on a top surface of the word line, the sidewall of the word line, a bottom surface of the word line, and the sidewalls of the dielectric layers; a semiconductor strip on the tunneling strip; a bit line contacting a sidewall of the semiconductor strip; and a source line contacting the sidewall of the semiconductor strip.

In some embodiments, the device further includes: an isolation region on the semiconductor strip, the bit line and the source line each extending through the isolation region, a first portion of the isolation region disposed between the semiconductor strip and each of the bit line and the source line. In some embodiments of the device, the sidewall of the word line forms acute angles with each of the top surface and the bottom surface of the word line. In some embodiments of the device, the sidewall of the word line forms obtuse angles with each of the top surface and the bottom surface of the word line. In some embodiments of the device, the sidewall of the word line forms right angles with each of the top surface and the bottom surface of the word line. In some embodiments of the device, the word line has sharp corner shapes. In some embodiments of the device, the word line has rounded corner shapes.

In an embodiment, a device includes: a first word line; a dielectric layer on the first word line; a second word line on the dielectric layer; a semiconductor strip having a first portion along a sidewall of the first word line, a second portion along a sidewall of the dielectric layer, and a third portion along a sidewall of the second word line; a bit line contacting the first portion and the third portion of the semiconductor strip; and an isolation region between the bit line and the second portion of the semiconductor strip.

In some embodiments, the device further includes: a tunneling strip between the semiconductor strip and each of the first word line and the second word line, the tunneling strip including a high-k ferroelectric material. In some embodiments, the device further includes: a tunneling strip between the semiconductor strip and each of the first word line and the second word line, the tunneling strip including a low-k dielectric material. In some embodiments, the device further includes: an isolation strip between the bit line and each of the first word line and the second word line; and a tunneling strip between the isolation strip and the semiconductor strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first word line;
   a first dielectric material over the first word line;
   a second word line over the first dielectric material;
   a memory film on a sidewall of the first word line, a sidewall of the first dielectric material, and a sidewall of the second word line, wherein the memory film is further disposed between a bottom surface of the second word line and a top surface of the first word line;

an oxide semiconductor material on a sidewall of the memory film, wherein the oxide semiconductor material is further disposed between the bottom surface of the second word line and the top surface of the first word line, wherein the oxide semiconductor material is further disposed between the sidewall of the first dielectric material and the sidewall of the first word line, wherein the oxide semiconductor material is further disposed between the sidewall of the first dielectric material and the sidewall of the second word line; and a source line and a bit line on a sidewall of the oxide semiconductor material.

2. The device of claim 1, wherein the memory film is a ferroelectric material.

3. The device of claim 1, wherein the memory film physically contacts the bottom surface of the second word line and the top surface of the first word line.

4. The device of claim 1 further comprising one or more second dielectric materials on the sidewall of the first word line, the sidewall of the first dielectric material, and the sidewall of the second word line, wherein the one or more second dielectric materials are disposed between the second word line and the first word line, and wherein the one or more second dielectric materials are disposed between the first word line and the memory film.

5. The device of claim 4 wherein the one or more second dielectric materials comprises: a silicon oxide layer.

6. The device of claim 4, wherein the memory film contacts a plurality of sidewalls of the one or more second dielectric materials in a top down view.

7. The device of claim 1, wherein the first word line is disposed over a substrate, and a center region of a top surface of the first word line is disposed farther from the substrate than edge regions of the top surface of the first word line.

8. The device of claim 1, wherein the first word line is disposed over a substrate, and a center region of a top surface of the first word line is disposed closer to the substrate than edge regions of the top surface of the first word line.

9. The device of claim 1 wherein the source line is insulated from the bit line by a third dielectric material, and wherein the third dielectric material is disposed between the first word line and the second word line.

10. A device comprising:
a pair of dielectric layers;
a word line between the dielectric layers, sidewalls of the dielectric layers being recessed from a sidewall of the word line;
a tunneling strip on a top surface of the word line, the sidewall of the word line, a bottom surface of the word line, and the sidewalls of the dielectric layers;
a semiconductor strip on the tunneling strip;
a bit line contacting a sidewall of the semiconductor strip; and
a source line contacting the sidewall of the semiconductor strip.

11. The device of claim 10 further comprising:
an isolation region on the semiconductor strip, the bit line and the source line each extending through the isolation region, a first portion of the isolation region disposed between the semiconductor strip and each of the bit line and the source line.

12. The device of claim 10, wherein the sidewall of the word line forms acute angles with each of the top surface and the bottom surface of the word line.

13. The device of claim 10, wherein the sidewall of the word line forms obtuse angles with each of the top surface and the bottom surface of the word line.

14. The device of claim 10, wherein the sidewall of the word line forms right angles with each of the top surface and the bottom surface of the word line.

15. The device of claim 10, wherein the word line has sharp corner shapes.

16. The device of claim 10, wherein the word line has rounded corner shapes.

17. A device comprising:
a first word line;
a dielectric layer on the first word line;
a second word line on the dielectric layer;
a semiconductor strip having a first portion along a sidewall of the first word line, a second portion along a sidewall of the dielectric layer, and a third portion along a sidewall of the second word line;
a bit line contacting the first portion and the third portion of the semiconductor strip; and
an isolation region between the bit line and the second portion of the semiconductor strip.

18. The device of claim 17 further comprising:
a tunneling strip between the semiconductor strip and each of the first word line and the second word line, the tunneling strip comprising a high-k ferroelectric material.

19. The device of claim 17 further comprising:
a tunneling strip between the semiconductor strip and each of the first word line and the second word line, the tunneling strip comprising a low-k dielectric material.

20. The device of claim 17 further comprising:
an isolation strip between the bit line and each of the first word line and the second word line; and
a tunneling strip between the isolation strip and the semiconductor strip.

* * * * *